United States Patent
Muroi et al.

(10) Patent No.: US 7,972,762 B2
(45) Date of Patent: Jul. 5, 2011

(54) POSITIVE RESIST COMPOSITION AND METHOD OF FORMING RESIST PATTERN

(75) Inventors: Masaaki Muroi, Kawasaki (JP); Kota Atsuchi, Kawasaki (JP); Takahiro Nakamura, Kawasaki (JP); Masakazu Yamada, Kawasaki (JP); Kensuke Saisyo, Kawasaki (JP); Masaru Takeshita, Kawasaki (JP); Takanori Yamagishi, Ichihara (JP); Tomo Oikawa, Ichihara (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 304 days.

(21) Appl. No.: 11/913,912

(22) PCT Filed: Apr. 26, 2006

(86) PCT No.: PCT/JP2006/308693
§ 371 (c)(1),
(2), (4) Date: Nov. 8, 2007

(87) PCT Pub. No.: WO2006/120897
PCT Pub. Date: Nov. 16, 2006

(65) Prior Publication Data
US 2009/0233220 A1 Sep. 17, 2009

(30) Foreign Application Priority Data
May 10, 2005 (JP) ................................. 2005-137777

(51) Int. Cl.
*G03F 7/004* (2006.01)
*G03F 7/30* (2006.01)
(52) U.S. Cl. ...................... 430/270.1; 430/326; 430/910
(58) Field of Classification Search ............... 430/270.1, 430/326, 910
See application file for complete search history.

(56) References Cited

U.S. PATENT DOCUMENTS

| | | | |
|---|---|---|---|
| 6,579,659 B2 * | 6/2003 | Uetani et al. | 430/270.1 |
| 7,005,230 B2 * | 2/2006 | Yamamoto et al. | 430/270.1 |
| 7,291,441 B2 * | 11/2007 | Sato | 430/270.1 |
| 7,695,889 B2 * | 4/2010 | Yamagishi et al. | 430/270.1 |
| 2002/0012869 A1 | 1/2002 | Adams et al. | |
| 2004/0058269 A1 | 3/2004 | Hada et al. | |
| 2004/0146802 A1 * | 7/2004 | Yamamoto et al. | 430/270.1 |
| 2004/0260031 A1 * | 12/2004 | Takeda et al. | 525/328.8 |
| 2005/0089796 A1 | 4/2005 | Funatsu et al. | |
| 2006/0046190 A1 * | 3/2006 | Sato | 430/270.1 |
| 2007/0254247 A1 * | 11/2007 | Yamamoto et al. | 430/495.1 |

FOREIGN PATENT DOCUMENTS

| | | |
|---|---|---|
| EP | 0856773 A1 | 8/1998 |
| JP | 09-297396 | 11/1997 |
| JP | 11-084659 | 3/1999 |
| JP | 2002-20639 | 1/2002 |
| JP | 2002-348328 | 12/2002 |
| JP | 2003-140351 | 5/2003 |
| JP | 2003-167347 | 6/2003 |
| TW | 482946 | 4/2002 |

OTHER PUBLICATIONS

Office Action issued in corresponding Taiwan Patent Application No. 095115905, dated Jun. 9, 2009.
International Search Report in Corresponding PCT Application No. PCT/JP2006/308693, dated May 23, 2006.

* cited by examiner

*Primary Examiner* — John S Chu
(74) *Attorney, Agent, or Firm* — Knobbe, Martens, Olson & Bear, LLP

(57) ABSTRACT

Provided are a positive resist composition and a resist pattern forming method having fewer defects and superior lithographic characteristics. The positive resist composition includes a resin component (A) which has on a main chain a structural unit derived from an (α-lower alkyl)acrylate ester and exhibits increased alkali solubility under the action of an acid, and an acid generating component (B) which generates the acid upon irradiation with radiation, in which the resin component (A) is a copolymer having at least two structural units which is obtained by incorporating an acid when polymerizing at least one monomer for the production thereof.

10 Claims, No Drawings

POSITIVE RESIST COMPOSITION AND METHOD OF FORMING RESIST PATTERN

RELATED APPLICATIONS

This application is the U.S. National Phase filing under 35 U.S.C. §371 of PCT/JP2006/308693, filed Apr. 26, 2006, which designated the United States and was published in a language other than English, which claims priority under 35 U.S.C. §119(a)-(d) to Japanese Patent Application No. 2005-137777 filed May 10, 2005. The content of these applications is incorporated herein by reference in their entireties.

TECHNICAL FIELD

The present invention relates to a positive resist composition and a method of forming a resist pattern.

BACKGROUND ART

In recent years, in the production of semiconductor device and liquid crystal display device, advances in lithography techniques have led to rapid progress in the miniaturization of semiconductor device and liquid crystal display device. Typically, these techniques for achieving further miniaturization involve shortening of the wavelength of the exposure light source. Until recently, ultraviolet radiation such as g-lines and i-lines have been used as the exposure light source, but recently, mass production using KrF excimer lasers (248 nm) has been employed, and even ArF excimer lasers (193 nm) are now starting to be introduced. In addition, lithography techniques using $F_2$ excimer lasers (157 nm), EUV (extreme ultraviolet radiation), or EB (electron beams) as a light source (radiation source) are also being investigated.

There has been required a resist used in such a light source having a short wavelength that satisfies a high resolution capable of reproducing a pattern with a very minute dimension and high sensitivity for the light source having a short wavelength.

One example of a known resist is a chemically amplified resist containing a base resin and an acid generator (hereinafter, referred to as PAG) that generates acid on exposure. As the chemically amplified resist, a positive type resist that increases alkali solubility of an exposed portion and a negative type resist that decreases alkali solubility of an exposed portion can be mentioned.

So far, as the base resin of the chemically amplified resist, polyhydroxystyrene (PHS), which exhibits high transparency to KrF excimer laser, or PHS resins of which the hydroxyl groups have been protected with an acid dissociable dissolution inhibiting group have been used. However, since the PHS resins include an aromatic ring such as a benzene ring, transparency to light having a short wavelength of shorter than 248 nm, that is, 193 nm is not sufficient. Hence, there is a problem in that the chemically amplified resist using PHS resins as base resin components exhibits low resolution in a process of using light of 193 nm.

Therefore, as the base resins of the resist which has been currently used in ArF excimer laser lithography, resins (acrylic resins) having a structural unit derived from (meth) acrylate ester in a main chain have been generally used because of their excellent transparency to light of around 193 nm (see, Patent Document 1).

Furthermore, the resists are required to exhibit a variety of excellent lithographic properties such as the depth of focus (DOF) and resist pattern shape, in addition to sensitivity and resolution.

[Patent Literature 1] Japanese Unexamined Patent Publication 2003-167347

DISCLOSURE OF THE INVENTION

Problems to be Solved by the Invention

In recent years, a high-resolution resist pattern has been demanded, as a result, in addition to the above-described lithographic properties, the improvement of defects (development defects) is required more strongly than ever. These defects indicate problems in general, for example, detected by a surface defect inspection apparatus (trade name: KLA) manufactured by KLA-Tencor Corporation when the resist pattern after development is observed from directly above. Examples of the problems include scum after development, bubbles, dust, bridge between resist patterns, partial discoloration, and precipitations. Such problems become more serious as the pattern dimensions are smaller. Particularly, from the view point where ArF excimer laser light is used, that is where $F_2$ excimer laser light, EUV, EB, or the like is used in addition to ArF excimer laser light as a light source, there has been a demand to solve the problems in defects.

However, in the conventional resist compositions, a decrease in defects and excellent lithographic properties could not be obtained.

The present invention has been made under these circumstances and an object of the present invention is to provide a positive resist composition and a method of forming a resist pattern having less defects and excellent in lithographic properties.

Means for Solving the Problems

In order to achieve the above-described objects, the present invention employs the following constitutions.

That is, according to a first aspect of the invention, there is provided a positive resist composition which includes a resin component (A) having on a main chain a structural unit derived from an (α-lower alkyl)acrylate ester and exhibits increased alkali solubility under the action of an acid, and an acid generating component (B) which generates the acid upon irradiation with radiation, in which the resin component (A) is a copolymer having at least two structural units which is obtained by incorporating an acid when polymerizing at least one monomer for the production thereof.

Furthermore, according to a second aspect of the invention, there is provided a resist pattern forming method which includes forming a resist film on a substrate by using the positive resist composition according to the first aspect, exposing the resist film, and forming a resist pattern by developing the resist film.

In the invention, the term '(α-lower alkyl)acrylate ester' refers to either one, or both of an α-lower alkyl acrylate ester such as methacrylate ester, and an acrylate ester.

The term 'α-lower alkyl acrylate ester' refers to an ester in which a hydrogen atom bonding to a carbon atom of acrylate ester is substituted by a lower alkyl group.

The term 'Structural unit derived from an (α-lower alkyl) acrylate ester' refers to a structural unit having a cleavage structure of ethylenic double bonds of the (α-lower alkyl) acrylate ester.

The term 'Structural unit' refers to a monomer unit which contributes to the formation of a polymer (resin component).

The term 'having a structural unit derived from an (α-lower alkyl)acrylate ester in a main chain' refers to a configuration in which two carbon atoms derived from ethylenic double bonds of a structural unit derived from the (α-lower alkyl) acrylate ester constitute a main chain of the polymer.

An 'alkyl group' includes a straight chained, branched chain, and cyclic saturated hydrocarbon group having monovalence unless no particular description is made.

A 'lower alkyl group' is an alkyl group having 1 to 5 carbon atoms.

The term 'exposure' is a concept including whole exposure to radiation.

Advantages Of The Invention

According to the invention, a positive resist composition and a resist pattern forming method having less defects and exhibiting excellent lithographic properties can be provided.

BEST MODES FOR CARRYING OUT THE INVENTION

Positive Resist Composition

A positive resist composition of the invention includes a resin component (A) (hereinafter, referred to as a component (A)) having on a main chain a structural unit derived from an (α-lower alkyl)acrylate ester and exhibiting increased alkali solubility by the action of an acid, and an acid generating component (B) (hereinafter, referred to as a component (B)) generating the acid upon irradiation with radiation.

The positive resist composition of the present invention includes the component (A) that increases alkali solubility under the action of acid, and the component (B). Accordingly, acid generated from the component (B) on exposure to light reacts with the (A) component and thus the alkali solubility of the component (A) increases, thereby changing the component (A) from an alkali-insoluble to an alkali-soluble. As a result, when a resist film obtained from the positive resist composition is selectively exposed during the formation of a resist pattern, or alternatively, is exposed and then subjected to a post exposure baking treatment (PEB), the exposed portions of the resist change from an alkali-insoluble to an alkali-soluble, whereas the unexposed portions remain insoluble in alkali, meaning that alkali developing can then be used to form a positive resist pattern.

<Component (A)>

The component (A) is a copolymer having at least two kinds of structural units obtained under the presence of an acid in a process of producing the copolymer by polymerizing at least one monomer.

Since the component (A) is a resin containing on a main chain a structural unit (a1) derived from (α-lower alkyl)acrylate ester, such at least one monomer used to obtain the component (A) needs to contain at least one (α-lower alkyl) acrylate ester.

By the presence of the acid in the process of producing the copolymer by polymerizing at least one monomer containing at least (α-lower alkyl)acrylate ester, this acid reacts on (α-lower alkyl)acrylate ester before polymerization and/or a part of the structural unit (a1) in the polymer generated by polymerizing the monomer and changes its structure. As a result, a structural unit different from the structural unit (a1) is obtained so that a copolymer containing the structural unit (a1) and a structural unit different therefrom can be obtained.

In this case, when an ester terminal moiety of (α-lower alkyl)acrylate ester before the polymerization or an ester terminal moiety of the structural unit (a1) dissociates by the acid, (α-lower alkyl)acrylate or a structural unit (a2) derived from (α-lower alkyl)acrylic acid is produced. As a result, a copolymer having the structural unit (a1) and the structural unit (a2) derived from (α-lower alkyl)acrylic acid is obtained.

That is, when the acid reacts on a part of the (α-lower alkyl)acrylate ester before the polymerization and dissociates its ester terminal moiety, (α-lower alkyl)acrylic acid is produced. Further, its (α-lower alkyl)acrylic acid is polymerized with (α-lower alkyl)acrylate ester, and thus the copolymer having the structural unit (a1) and the structural unit (a2) is obtained.

On the other hand, when the acid reacts on a part of the structural unit (a1) in the polymer produced by the polymerization of the monomer including (α-lower alkyl)acrylate ester, the structural unit (a1) of this part changes to the structural unit (a2) and thus the copolymer having the structural unit (a1) and the structural unit (a2) is obtained as described above.

Here, the structural unit (a1) is a structural unit in which R is a hydrogen atom or a lower alkyl group and X is a monovalent organic group in the following general formula (a-1).

In addition, 'ester terminal moiety' means X in the following general formula (a-1). Namely, the 'ester terminal moiety' means a group bonding to an oxygen atom in the vicinity of a carbonyl group in (α-lower alkyl)acrylate ester.

[General Formula 1]

(a-1)

In the formula, the lower alkyl group serving as R is an alkyl group having 1 to 5 carbon atoms and specific examples thereof include a straight chain or branched alkyl group such as a methyl group, ethyl group, propyl group, isopropyl group, n-butyl group, isobutyl group, tert-butyl group, pentyl group, isopentyl group, or neopentyl group. From a viewpoint of industrial availability, it is preferable that a hydrogen atom or a methyl group be bonded to α-position.

In the present invention, an 'organic group' includes carbon atoms and may include other atoms (for example, a hydrogen atom, an oxygen atom, a nitrogen atom, a sulfur atom, a halogen atom (such as a fluorine atom or a chlorine atom) or the like). Examples of monovalent organic groups serving as X are not particularly limited and the ester terminal moiety of (α-lower alkyl)acrylate ester (such as, acid dissociable dissolution inhibiting groups, monocyclic or polycyclic lactone-containing groups, polar group-containing alicyclic hydrocarbon groups, and polycyclic alicyclic hydrocarbon groups) in the structural units (a11) to (a14) described below can be mentioned.

In the present invention, the structural unit (a2) is a structural unit in which R is a hydrogen atom or a lower alkyl group and X is a hydrogen atom in the general formula (a-1). As the structural unit (a2), the following structural unit represented by the following general formula (4) is preferred.

[General Formula 2]

(4)

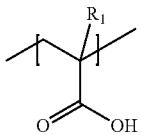

(wherein, $R_1$ represents a hydrogen atom or a methyl group.)

Here, examples of the structural unit (a2) also include a structural unit formed by dissociating the ester terminal moiety of the structural unit derived from (α-lower alkyl)acrylate ester in the component (A) after polymerization under the action of acid, as well as a structural unit formed by cleavage of ethylenic double bonds of (α-lower alkyl)acrylate ester during polymerization.

In the present invention, the structural unit (a2) is preferably at least one of a structural unit (a2"-1) derived from (α-lower alkyl)acrylic acid formed by dissociating the ester terminal moiety of (α-lower alkyl)acrylate ester under the action of acid and a structural unit (a2"-2) formed by dissociating the ester terminal moiety of the structural unit derived from (α-lower alkyl)acrylate ester under the action of acid.

Particularly, when the component (A) includes a structural unit (a11) derived from (α-lower alkyl)acrylate ester having acid dissociable dissolution inhibiting groups described below, that is, when the component (A) is a copolymer having the structural unit (a11) and the structural unit (a2), it is preferable that the component (A) include as the structural unit (a2) at least one of the structural unit (a2"-1-1) and the structural unit (a2"-2-1) described below from the viewpoint of the effect of the present invention and ease of synthesis.

'structural unit (a2"-1-1)': a structural unit derived from an (α-lower alkyl)acrylic acid produced by dissociating acid dissociable dissolution inhibiting groups of (α-lower alkyl)acrylate ester deriving the structural unit (a11) under the action of acid (which is added when producing the copolymer).

'structural unit (a2"-2-1)': a structural unit formed by dissociating acid dissociable dissolution inhibiting groups of the structural unit (a11) under the action of the acid.

In the present invention, acid capable of dissociating a part of (α-lower alkyl)acrylate ester is used in the polymerization process without limiting the structure of the ester terminal of (α-lower alkyl)acrylate ester. The acid dissociable dissolution inhibiting groups used in typical chemically amplified resist compositions dissociate even in acid having acidity lower than that.

Therefore, when the component (A) includes the structural unit (a11), the structural unit (a2"-1-1) and/or the structural unit (a2"-2-1) are readily produced.

The structural unit (a2"-1-1) and/or the structural unit (a2"-2-1) are/is particularly easily produced when the structural unit (a11) is a unit including X in the general formula (a-1) being the acid dissociable dissolution inhibiting group, as in a structural unit shown by the general formulae (a1-0-2), (a1-1-01), or (a1-1-03) which will be described later.

In the present invention, a total amount of the structural unit (a1) and the structural unit (a2) within the component (A), relative to the combined total of all the structural units that constitute the component (A), is preferably within a range of 50 to 100 mol %, even more preferably 80 to 100 mol %. With the total amount in such a range, a resist composition having high transparency to the light source after an ArF excimer laser and excellent lithographic properties is obtained.

Moreover, the proportion of the structural unit (a2) within the component (A), relative to the combined total of all the structural units that constitute the component (A), is preferably within a range of 1 to 20 mol %, even more preferably 2 to 15 mol %, and most preferably 2 to 6 mol %, since the proportion of the structural unit (a2) in such a range yields superior effects of the present invention. When the proportion of the structural unit (a2) is more than 1 mol %, an effect for reducing defects is excellent and when it is less than 20 mol %, lithographic properties are good.

Structural Unit (a11)

In the present invention, it is preferable that the component (A) include the structural unit (a11) derived from (α-lower alkyl)acrylate ester having acid dissociable dissolution inhibiting groups as the structural unit (a1). That is, it is preferable that the component (A) is the copolymer having the structural unit (a11) and the structural unit (a2).

Examples of the lower alkyl group which serves as a substituent on α-position of (α-lower alkyl)acrylate ester are the same as those of the lower alkyl group of R in the general formula (a-1).

The acid dissociable dissolution inhibiting groups in the structural unit (a11) can dissociate from the component (A) by the action of the acid generated from a component (B) described below. Any one of the acid dissociable dissolution inhibiting groups of a base resin for the chemically amplified resist which have been proposed can be used as long as it has an alkali solubility inhibiting effect that renders the entire component (A) insoluble in alkali prior to dissociation and then changes the component (A) from an alkali-insoluble to alkali-soluble after the dissociation. As the acid dissociable dissolution inhibiting group, groups that form a cyclic or chain-like tertiary alkyl ester or a cyclic or chain-like tertiary alkoxyalkyl ester with the carboxyl group of the (meth) acrylic acid are the most widely known. Furthermore, '(meth) acrylate ester' means any one of or both of acrylate ester and methacrylate ester.

Here, the tertiary alkyl ester has a structure in which a hydrogen atom of a carboxyl group is substituted by an alkyl group or a cycloalkyl group so as to form ester and a tertiary carbon atom of the alkyl group or the cycloalkyl group is bonded to a oxygen atom on the terminal of the carbonyloxy group (—C(O)—O—). When the acid reacts on this tertiary alkyl ester, a cleavage of a bond between the oxygen atom and the tertiary carbon atom occurs.

Further, the alkyl group or the cycloalkyl group may include a substituent.

Hereinafter, acid dissociable groups having a carboxyl group and a tertiary alkyl ester are called a 'tertiary alkyl ester-type acid dissociable dissolution inhibiting group'.

In addition, a cyclic or a chain alkoxyalkyl ester has a structure in which a hydrogen atom of a carboxyl group is substituted by an alkoxyalkyl group so as to form ester and the alkoxyalkyl group is bonded to a oxygen atom on the terminal of the carbonyloxy group (—C(O)—O—). When the acid reacts on this alkoxyalkyl ester, a cleavage of a bond between the oxygen atom and the alkoxyalkyl group occurs.

The structural unit (a11) preferably includes at least one selected from the group consisting of structural units shown by the following general formulae (a1-0-1) and (a1-0-2).

[General Formula 3]

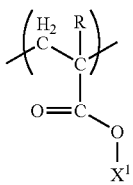

(a1-0-1)

(wherein, R represents a hydrogen atom or a lower alkyl group; $X^1$ represents an acid dissociable dissolution inhibiting group.)

[General Formula 4]

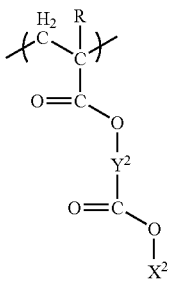

(a1-0-2)

(wherein, R represents a hydrogen atom or a lower alkyl group; $X^2$ represents an acid dissociable dissolution inhibiting group; $Y^2$ represents an aliphatic cyclic group.)

In the general formula (a1-0-1), the same description applies as that used for R.

$X^1$ is not particularly limited as long as it is the acid dissociable dissolution inhibiting group and examples thereof include an alkoxyalkyl group, tertiary alkyl ester-type acid dissociable dissolution inhibiting group, and the like. Of these, the tertiary alkyl ester-type acid dissociable dissolution inhibiting group is preferred.

As the tertiary alkyl ester-type acid dissociable dissolution inhibiting group, aliphatic branched acid dissociable dissolution inhibiting groups and acid dissociable dissolution inhibiting groups having aliphatic cyclic groups can be used.

In this description, the term "aliphatic" is a relative concept used in relation to the term "aromatic", and defines a group or compound that has no aromaticity, Furthermore, the term "aliphatic cyclic group" describes a monocyclic group or polycyclic group that has no aromaticity.

The 'aliphatic cyclic group' in the structural unit (a11) may or may not include a substituent. Examples of the substituent include a lower alkyl group having 1 to 5 carbon atoms, a fluorine atom, a fluorinated lower alkyl group having 1 to 5 carbon atoms substituted by a fluorine atom, an oxygen atom ($=O$), and the like.

Although the "aliphatic cyclic group" need not necessarily be a group formed solely from carbon and hydrogen, a hydrocarbon group (alicyclic hydrocarbon group) is preferred. Furthermore, the 'hydrocarbon group' may be either saturated or unsaturated, but is generally saturated. A polycyclic group is preferable.

Specific examples of this type of aliphatic cyclic group include lower alkyl groups and groups in which one or more hydrogen atoms have been removed from a polycycloalkane such as a monocycloalkane, bicycloalkane, tricycloalkane or tetracycloalkane, which may, or may not, be substituted with a lower alkyl group, a fluorine atom or a fluorinated alkyl group. Specific examples of suitable groups include groups in which one or more hydrogen atoms have been removed from a monocycloalkane such as cyclopentane or cyclohexane, or a polycycloalkane such as adamantane, norbornane, isobornane, tricyclodecane or tetracyclododecane.

More specific examples of the structural unit derived from (α-lower alkyl)acrylate ester having tertiary alkyl ester-type acid dissociable dissolution inhibiting groups include a structural unit represented by the following general formula (1).

[General Formula 5]

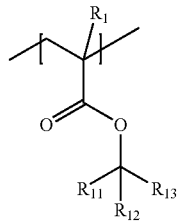

(1)

(wherein, $R^1$ represents a hydrogen atom or a methyl group, $R^{11}$ represents an alkyl group having 1 to 4 carbon atoms, and $R^{12}$ and $R^{13}$ each independently, represents, a straight chain or branched alkyl group having 1 to 12 carbon atoms, a monocyclic or bridged cyclic alicyclic hydrocarbon group, or an alicyclic hydrocarbon group in which $R^{12}$ and $R^{13}$ are bonded to each other.)

Examples of aliphatic branched chain acid dissociable dissolution inhibiting groups include tert-butyl group, tert-amyl group, and the like.

In addition, examples of the aliphatic cyclic group-containing tertiary alkyl group include groups having tertiary carbon atoms on a cyclic skeleton of the cycloalkyl group and specific examples thereof include a 2-methyl-2-adamantyl group, 2-methyl-2-adamantyl group, and the like. Alternatively, there may be used aliphatic cyclic groups such as an adamantyl group and branched chain alkylene groups having tertiary carbon atoms incorporated in the aliphatic cyclic groups as described by the structural unit represented by the general formula (a1-1-03) described below. Particularly, a structural unit represented by the following general formula (a1-1-04).

[General Formula 6]

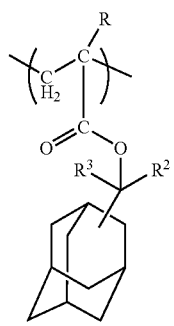

(a1-1-03)

(wherein, R represents a hydrogen atom or a lower alkyl group and $R^2$ and $R^3$ each represents, independently a lower alkyl group.)

[General Formula 7]

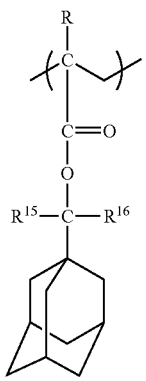

(a1-1-04)

[wherein, R is as defined above and $R^{15}$ and $R^{16}$ each represent a lower alkyl groups (which may be either a straight chain or branched group and preferably has 1 to 5 carbon atoms.)]

In the general formula (a1-1-03) and the general formula (a1-1-04), R is as defined above. The lower alkyl group of $R^2$ and $R^3$ and $R^{15}$ and $R^{16}$ may be either a straight chain or branched chain group and preferably is an alkyl group having 1 to 5 carbon atoms.

As the alkoxyalkyl group, a group represented by the following general formula (5) is preferred.

[General Formula 8]

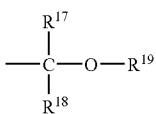

(5)

(wherein, $R^{17}$ and $R^{18}$ each represents, independently, an alkyl group or a hydrogen atom and $R^{19}$ represents an alkyl group or cycloalkyl group. Alternatively, each terminals of $R^{17}$ and $R^{19}$ may be bonded to each other to form a ring.)

In $R^{17}$ and $R^{18}$, the alkyl group preferably includes 1 to 15 carbon atoms and may be either a straight chain or branched chain group. Of these, an ethyl group and a methyl group are preferred and the methyl group is most preferred. Particularly, one of $R^{17}$ and $R^{18}$ is preferably a hydrogen atom and the other one is preferably a methyl group.

$R^{19}$ is an alkyl group or a cycloalkyl group and has 1 to 15 carbon atoms, and may be either a straight chain, branched chain, or cyclic group. When $R^{19}$ is a straight chain or branched chain group, groups having 1 to 5 carbon atoms are preferred, an ethyl group and a methyl group are more preferred, and the ethyl group is particularly preferred.

When $R^{19}$ is a cyclic group, groups having 4 to 15-carbon atoms are preferred, groups having 4 to 12 carbon atoms are more preferred and groups having 5 to 10 carbon atoms are particularly preferred. Specific examples thereof include groups in which one or more hydrogen atoms have been removed from a polycycloalkane such as a monocycloalkane, bicycloalkane, tricycloalkane or tetracycloalkane, which may, or may not, be substituted with a fluorine atom or a fluorinated alkyl group. Specific examples of suitable groups include groups in which one or more hydrogen atoms have been removed from a monocycloalkane such as cyclopentane or cyclohexane, or a polycycloalkane such as adamantane, norbornane, isobornane, tricyclodecane or tetracyclododecane. Particularly, a group in which one or more hydrogen atoms have been removed from an adamantine is preferred.

Furthermore, in the formula, $R^{17}$ and $R^{19}$ each represent, independently, an alkylene group having 1 to 5 carbon atoms and each terminals of $R^{17}$ and $R^{19}$ may be bonded to each other to form a ring.)

In this case, a cyclic group is formed by $R^{17}$, $R^{19}$, an oxygen atom bonded with $R^{19}$, and a carbon atom bonded with the oxygen atom and the $R^{17}$. Examples of this cyclic group include groups having 4 to 7 rings and groups having 4 to 6 rings are preferred. Specific examples thereof include a tetrahydropiranyl group, tetrahydrofuranyl group, and the like.

In the general formula (a1-0-2), R is as defined above. For the $X^2$, the same description applies as that used for $X^1$ in the above formula (a1-0-1).

$Y^2$ is a divalent aliphatic cyclic group.

Since $Y^2$ is a divalent aliphatic cyclic group, groups that the same description applies as that used for the 'aliphatic cyclic group' can be used except that groups in which more than two hydrogen atoms have been removed.

Specific examples of the structural unit (a11) include structural units represented by the following general formulas (a1-1) to (a1-4).

[General Formula 9]

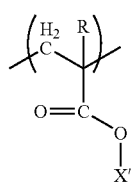

(a1-1)

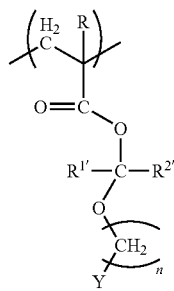

(a1-2)

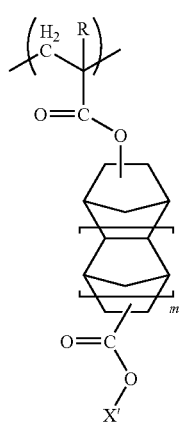

(a1-3)

-continued (a1-4)

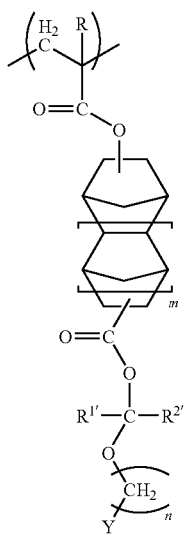

[where, X' represents a tertiary alkyl ester-type acid dissociable dissolution inhibiting group, Y represents a lower alkyl group having 1 to 5 carbon atoms or an aliphatic cyclic group; n represents either 0 or an integer of 1 to 3; m represents either 0 or 1; R is as defined above and $R^{1'}$ and $R^{2'}$ each represents, independently, a hydrogen atom or a lower alkyl group having 1 to 5 carbon atoms.]

At least one of $R^{1'}$ and $R^{2'}$ is preferably a hydrogen atom and, more preferably, both of them are hydrogen atoms. n is preferably 0 or 1.

X' is the same as the tertiary alkyl ester-type acid dissociable dissolution inhibiting group exemplified above as $X^1$.

For the aliphatic cyclic group of Y, the same description applies as that used for the aliphatic cyclic group described above.

Specific examples of groups of the above general formulas (a1-1) to (a1-4) are shown below.

[General Formula 10]

(a1-1-1)

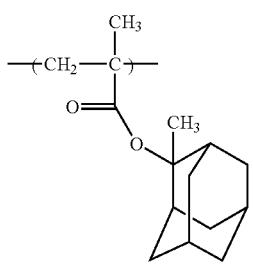

(a1-1-2)

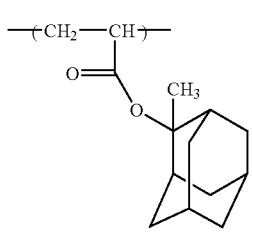

-continued (a1-1-3)

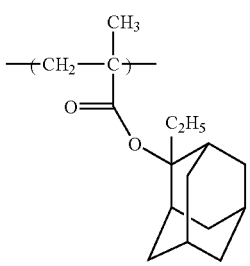

(a1-1-4)

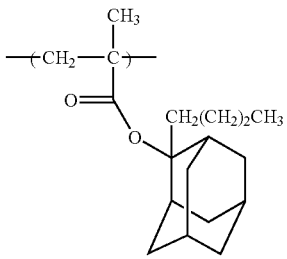

(a1-1-5)

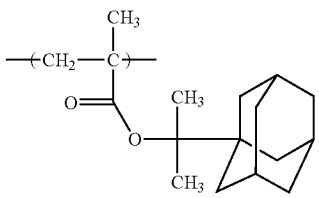

(a1-1-6)

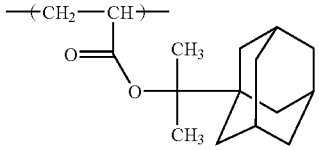

(a1-1-7)

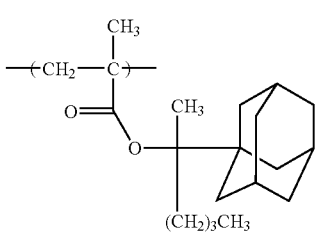

(a1-1-8)

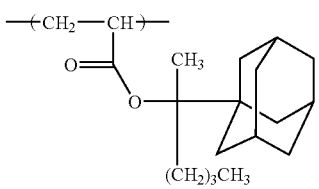

(a1-1-9)

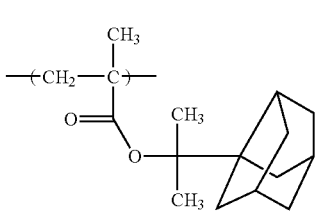

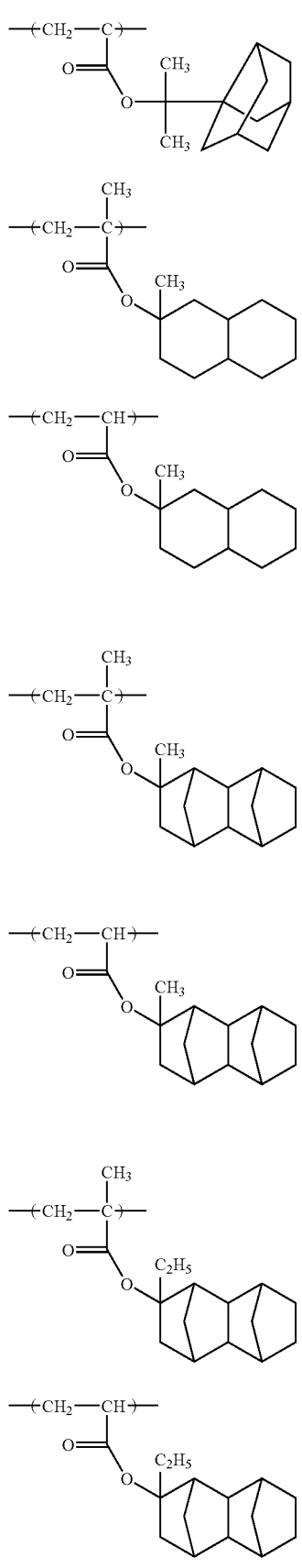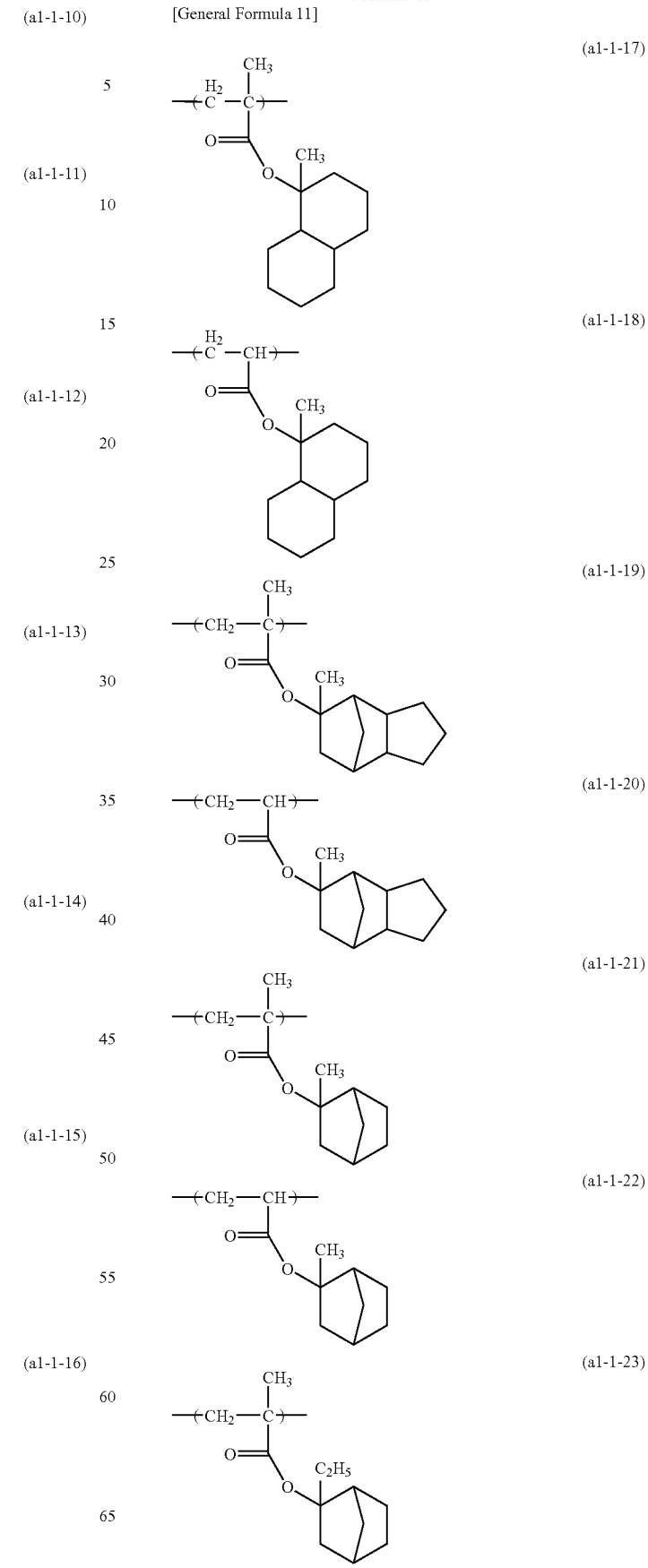
[General Formula 11]

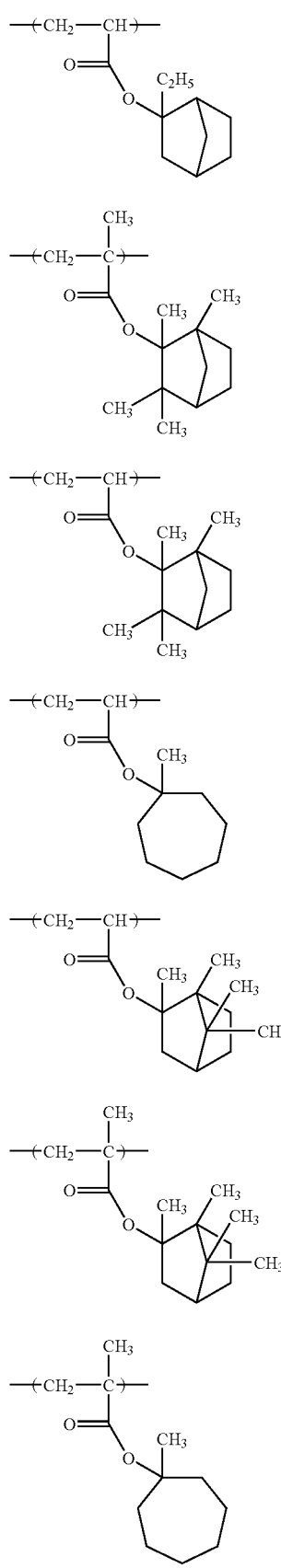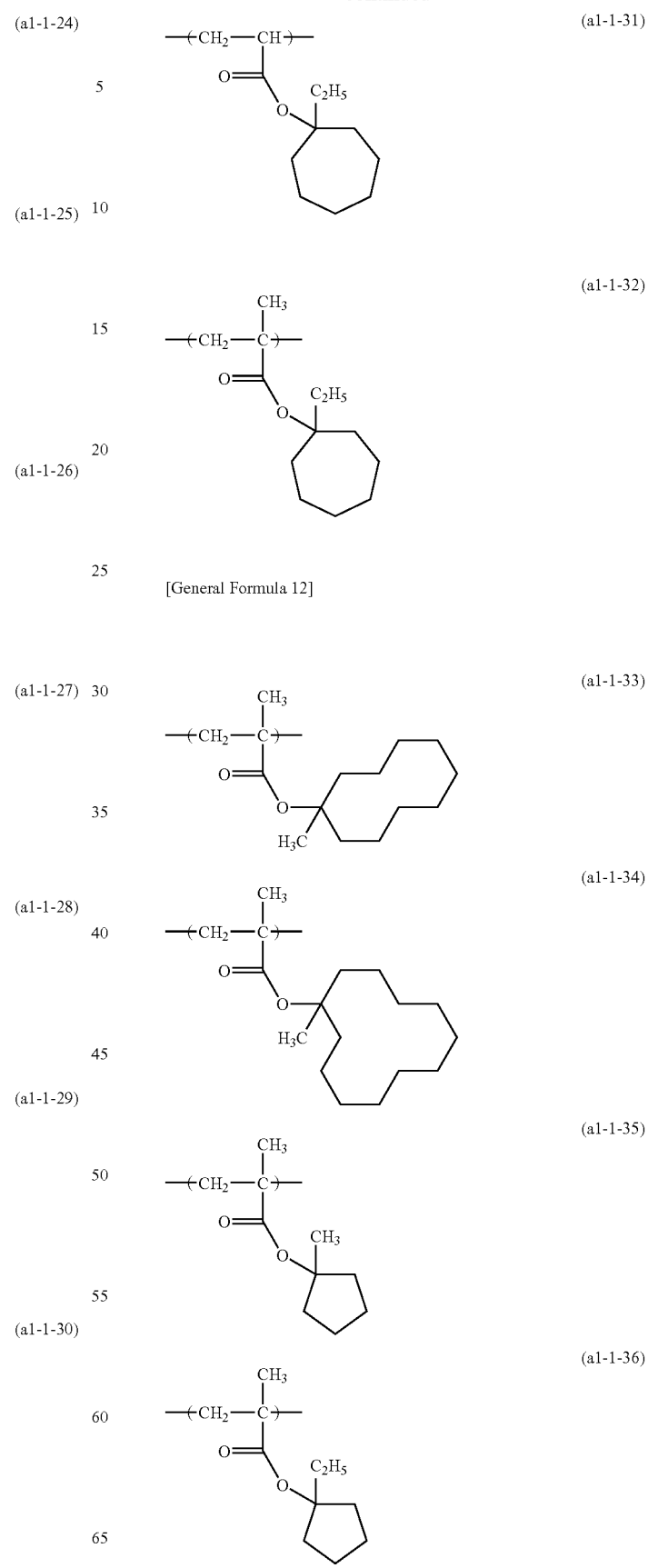
[General Formula 12]

(a1-1-37)
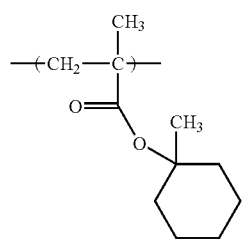
(a1-1-38)
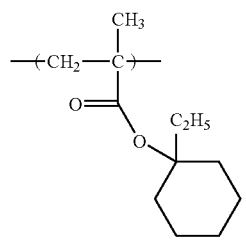
(a1-1-39)
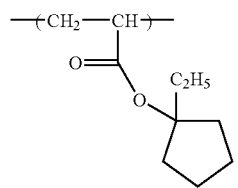
(a1-1-40)
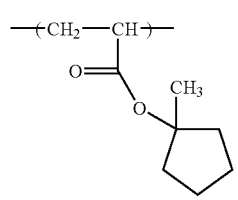
(a1-1-41)
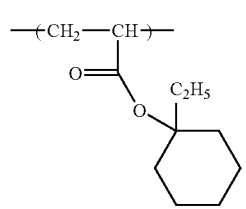
[General Formula 13]
(a1-2-1)
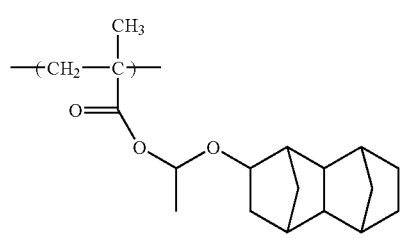
(a1-2-2)
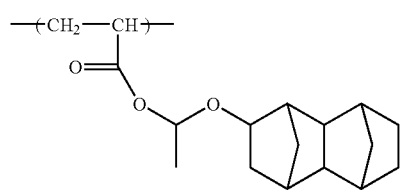
(a1-2-3)
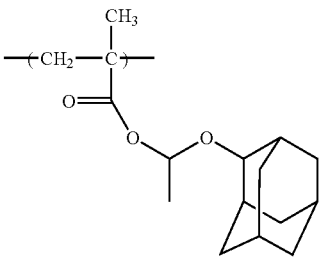
(a1-2-4)
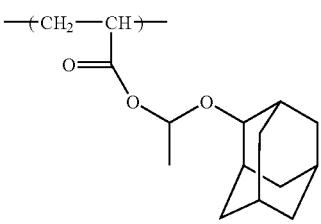
(a1-2-5)
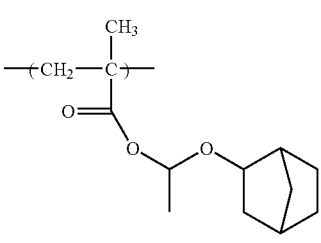
(a1-2-6)
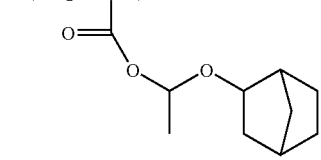
[General Formula 14]
(a1-2-7)
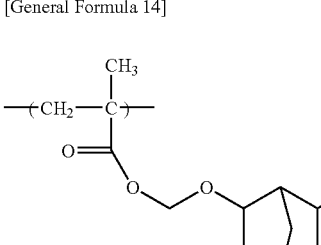
(a1-2-8)
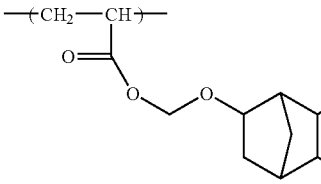
(a1-2-9)
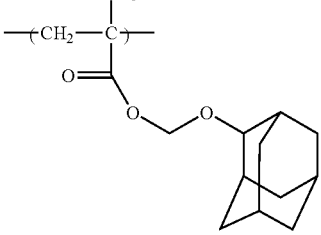

(a1-2-10)
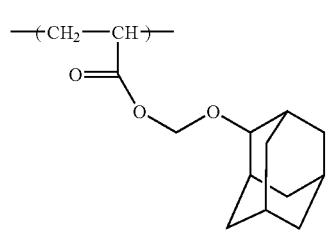
(a1-2-11)
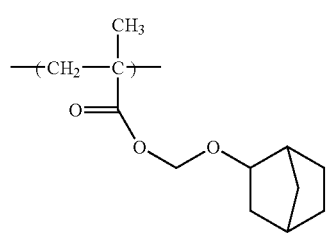
(a1-2-12)
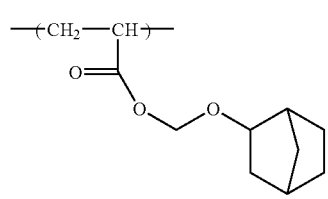
(a1-2-13)
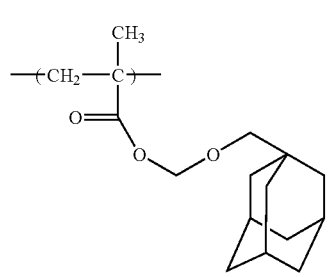
(a1-2-14)
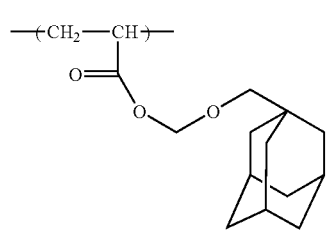
(a1-2-15)
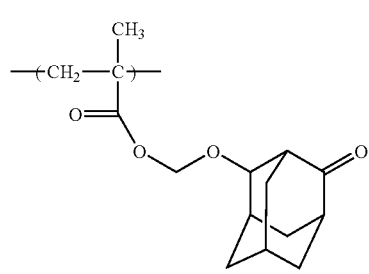
(a1-2-16)
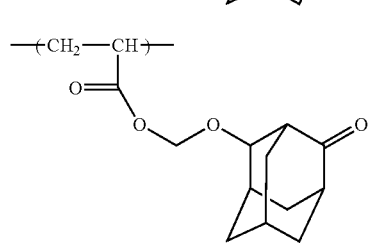
(a1-2-17)
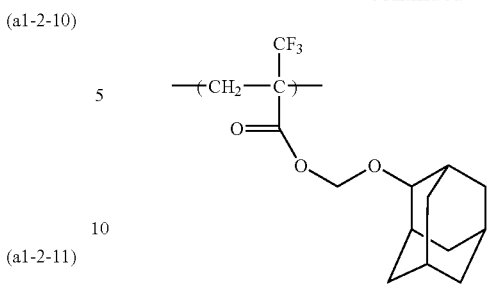
(a1-2-18)
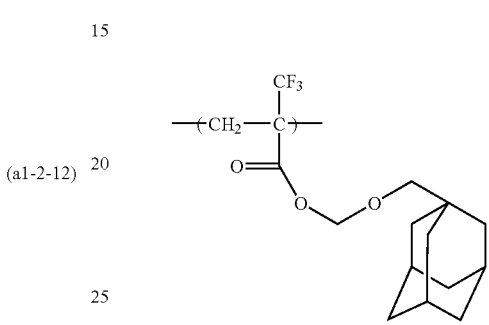
(a1-2-19)
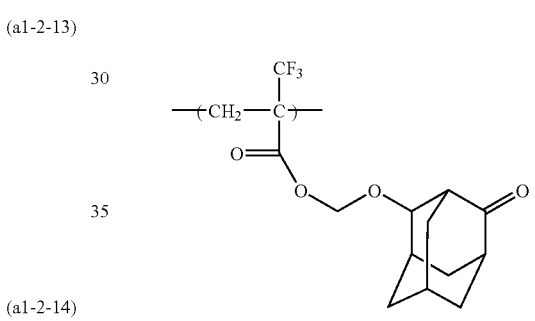
(a1-2-20)
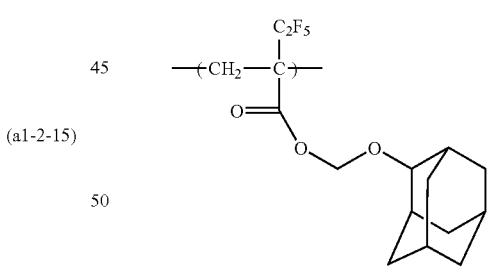
(a1-2-21)
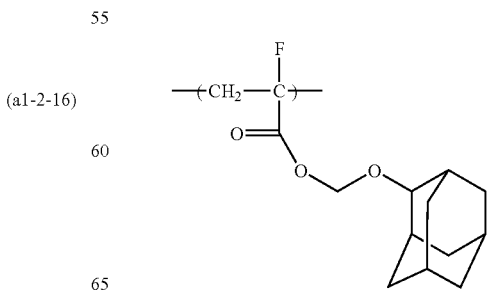

[General Formula 15]
(a1-3-1)
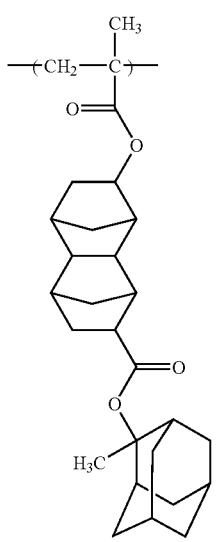
(a1-3-2)
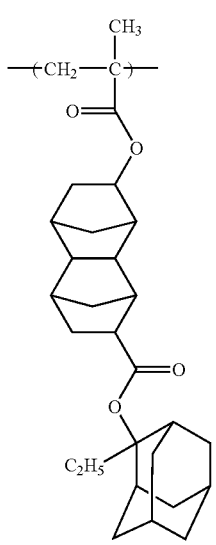
(a1-3-3)
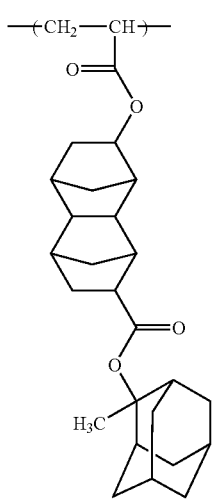
(a1-3-4)
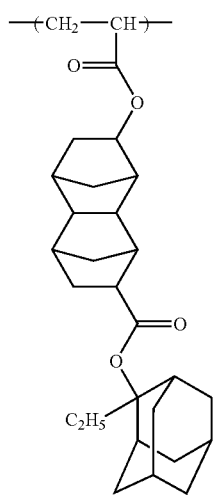
(a1-3-5)
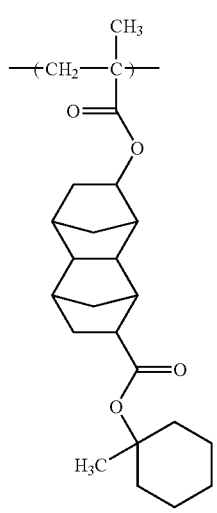
(a1-3-6)
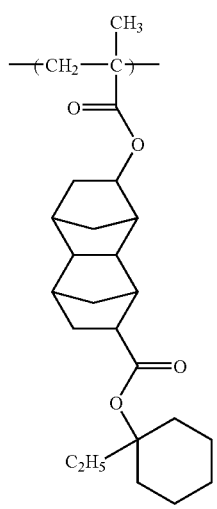

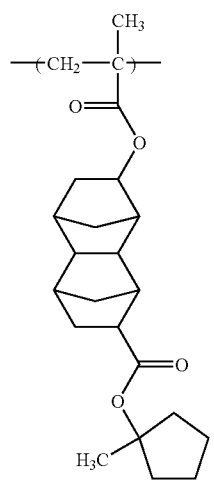 (a1-3-7)
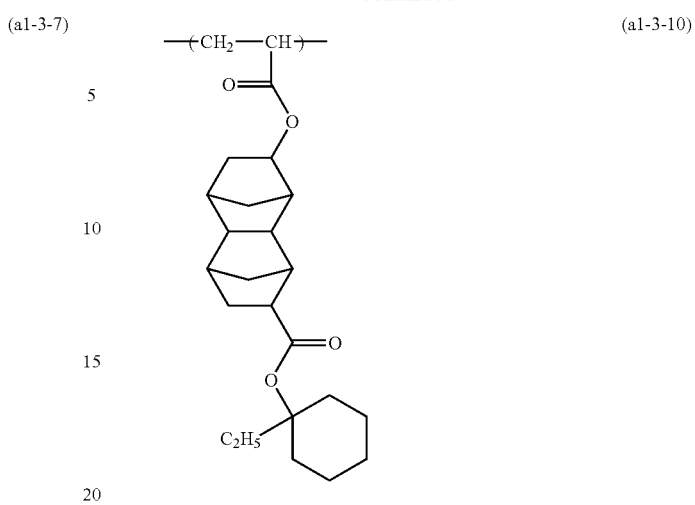 (a1-3-10)
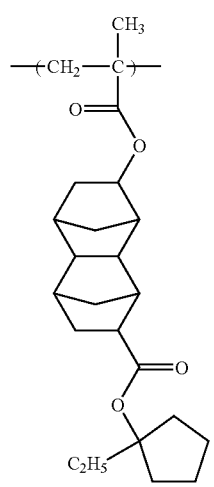 (a1-3-8)
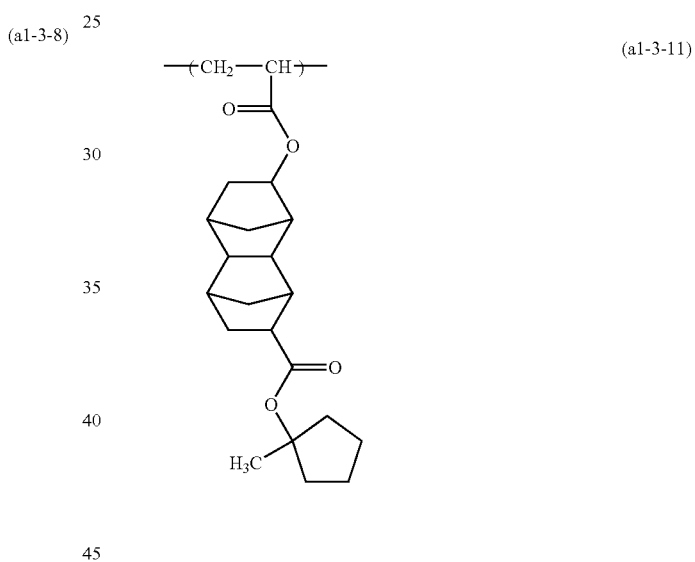 (a1-3-11)
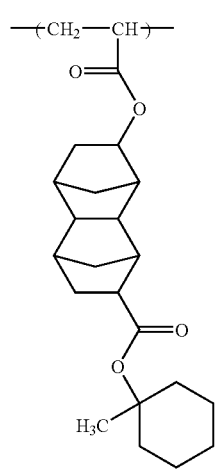 (a1-3-9)
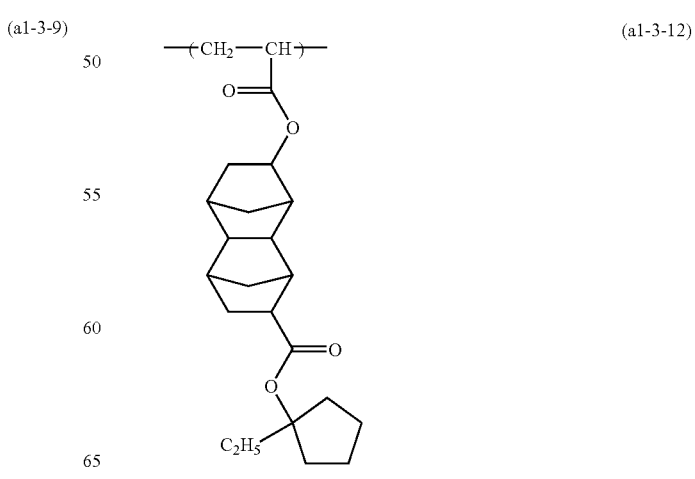 (a1-3-12)

[General Formula 16]
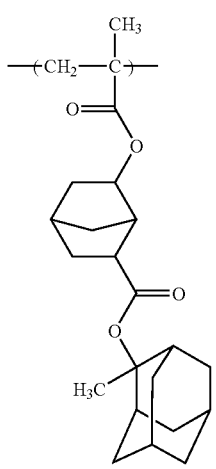
(a1-3-13)
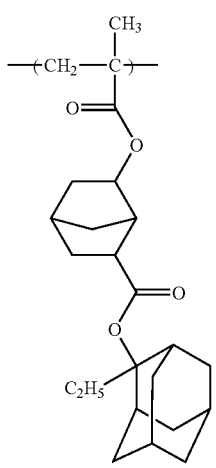
(a1-3-14)
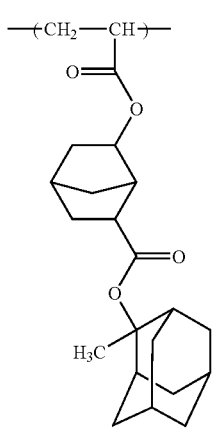
(a1-3-15)
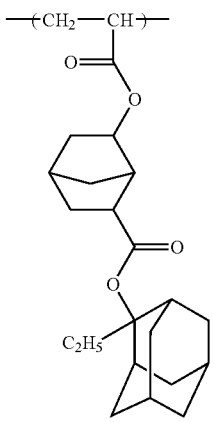
(a1-3-16)
(a1-3-17)
(a1-3-18)
(a1-3-19)

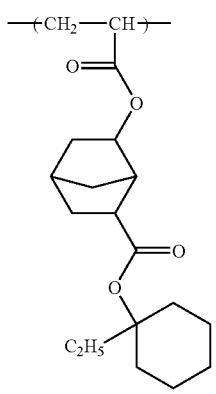
(a1-3-20)
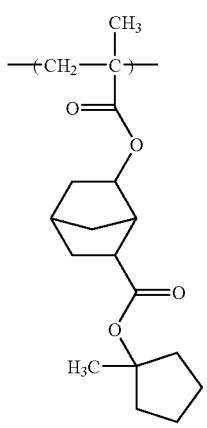
(a1-3-21)
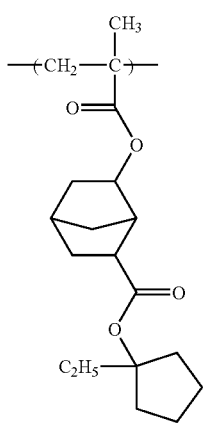
(a1-3-22)
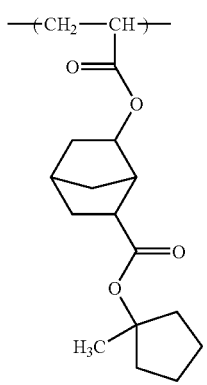
(a1-3-23)
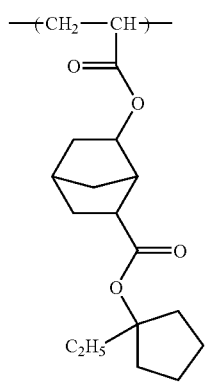
(a1-3-24)
[General Formula 17]
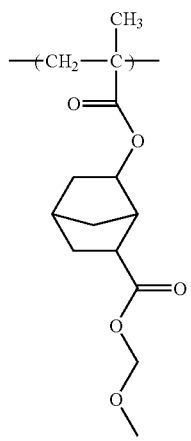
(a1-4-1)
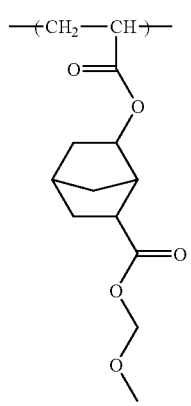
(a1-4-2)

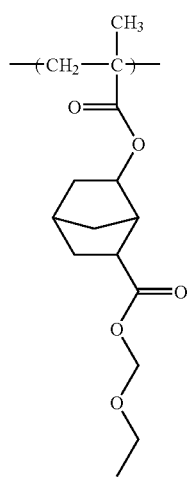 (a1-4-3)
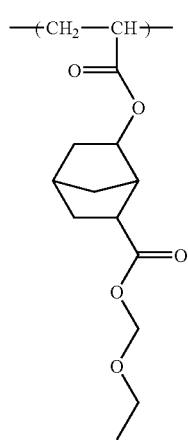 (a1-4-4)
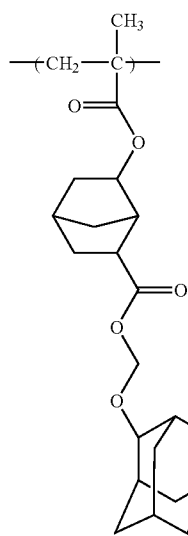 (a1-4-5)
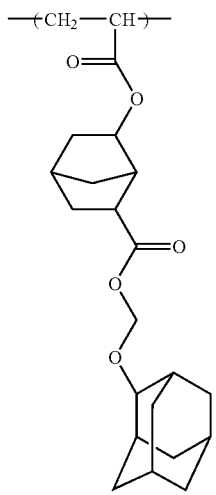 (a1-4-6)
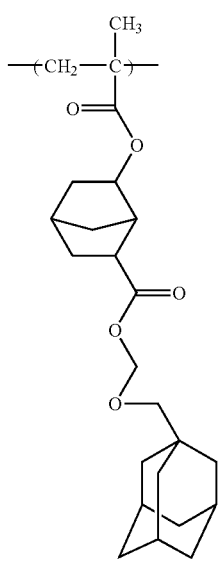 (a1-4-7)
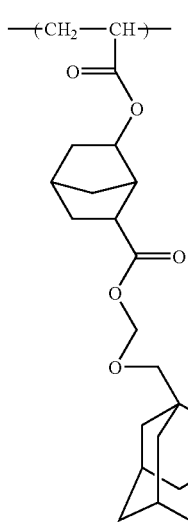 (a1-4-8)

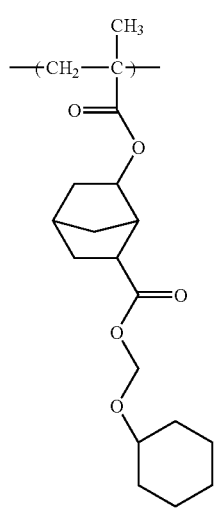
(a1-4-9)
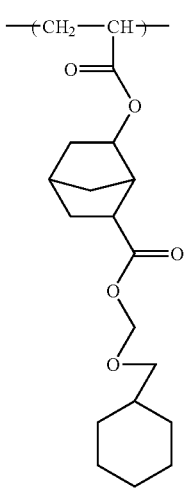
(a1-4-12)
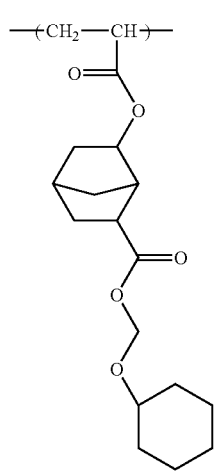
(a1-4-10)
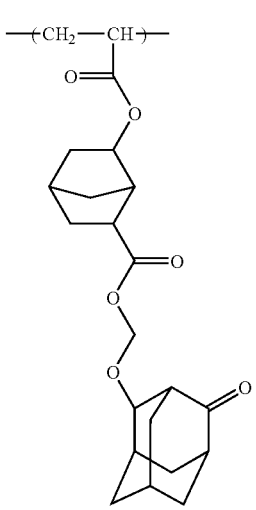
(a1-4-13)
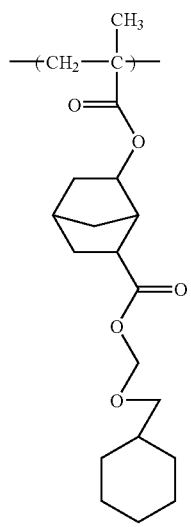
(a1-4-11)
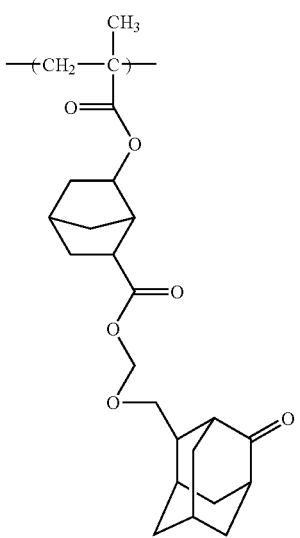
(a1-4-14)

(a1-4-15) 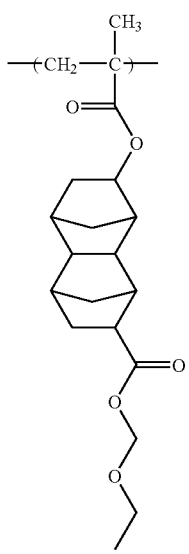
[General Formula 18]
(a1-4-16) 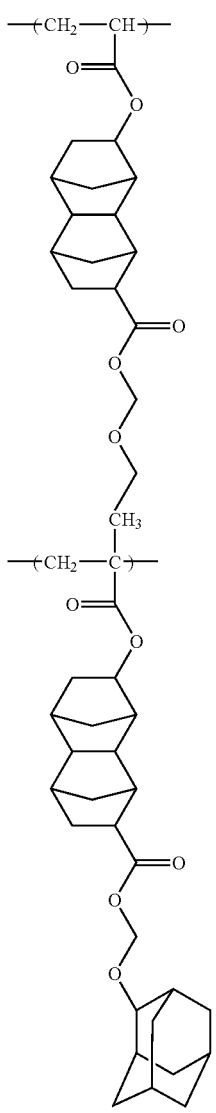
(a1-4-18) 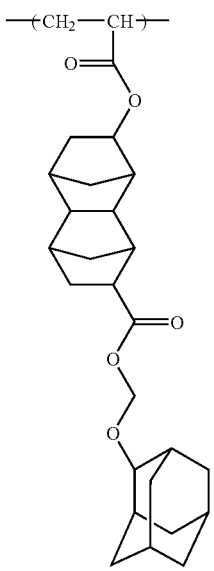
(a1-4-17)
(a1-4-19) 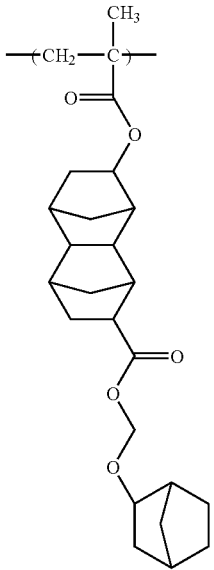
(a1-4-20) 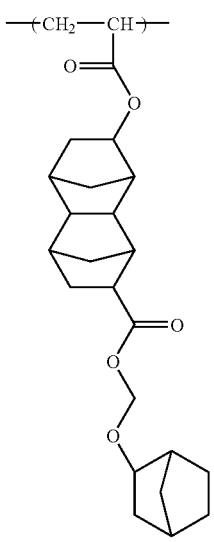

(a1-4-21) 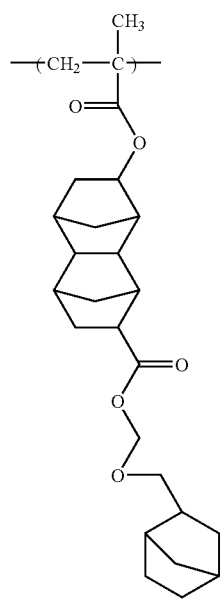
(a1-4-22) 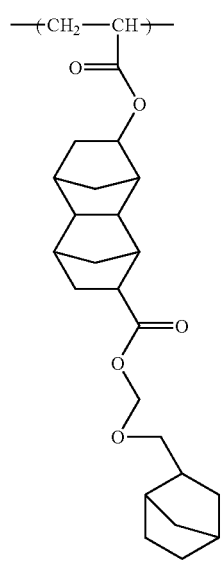
(a1-4-23) 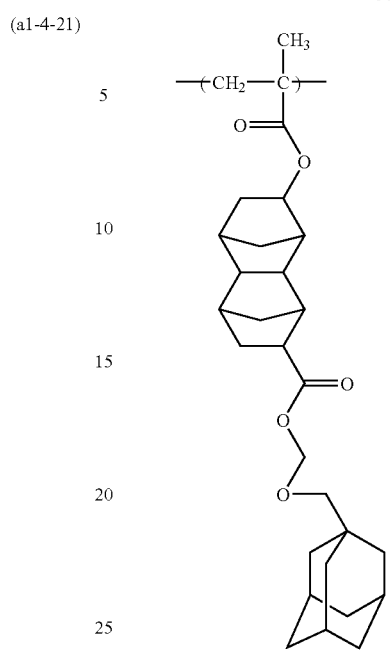
(a1-4-24) 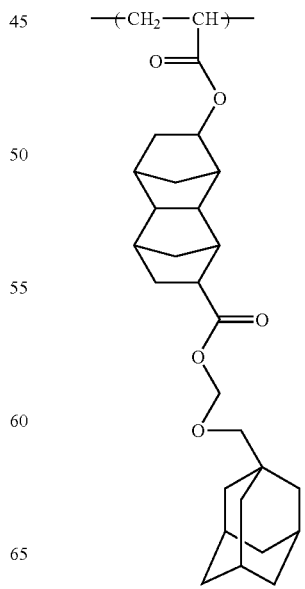

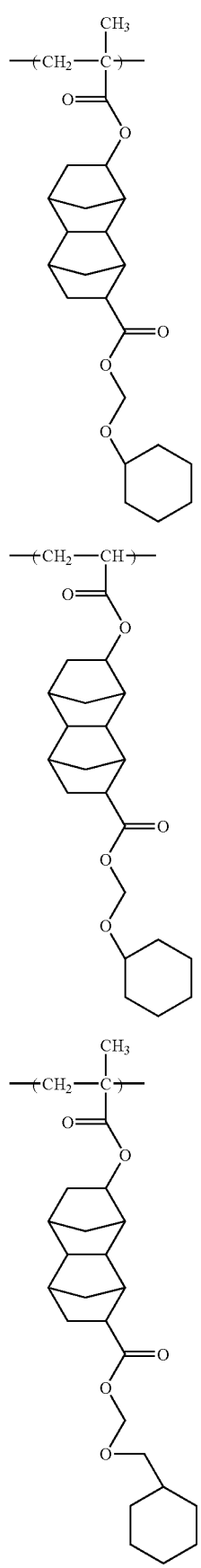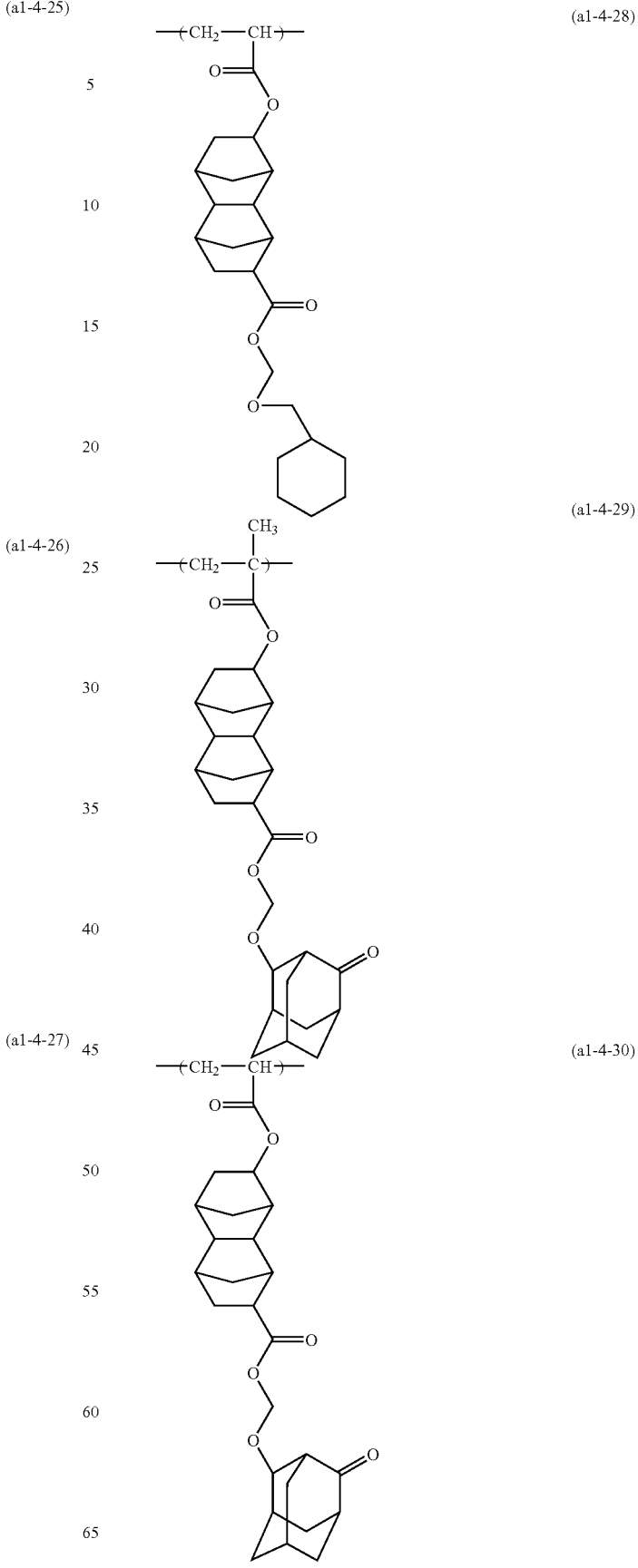

As the structural unit (a11), either a single type of structural unit may be used alone, or a combination of two or more different structural units may be used. Of the various possibilities, structural units represented by the general formula (a1-1) are preferred, and at least one selected from structural units represented by the formulas (a1-1-1) to (a1-1-6) or the formulas (a1-1-35) to (a1-1-41) is more preferable.

Furthermore, as the structural unit (a1), a structural unit represented by the general formula (a1-1-01) including structural units represented by the formulas (a1-1-1) to (a1-1-4) or a structural unit represented by the general formula (a1-1-02) including structural units represented by the formulas (a1-1-36), (a1-1-38), (a1-1-39) and (a1-1-41) is also preferred.

[General Formula 19]

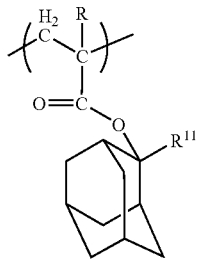

(a1-1-01)

(wherein, R represents a hydrogen atom or a lower alkyl group and $R^{11}$ represents a lower alkyl group.)

[General Formula 20]

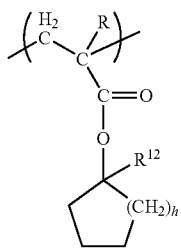

(a1-1-02)

(wherein, R represents a hydrogen atom or a lower alkyl group and $R^{12}$ represents a lower alkyl group. h is an integer of 1 to 3.)

In the general formula (a1-0-01), R is as defined above. For the lower alkyl group of $R^{11}$, the same description applies as that used for the lower alkyl group of R and a methyl group or an ethyl group is preferred.

In the general formula (a1-0-02), R is as defined above. For the lower alkyl group of $R^{12}$ the same description applies as that used for the lower alkyl group of R, and a methyl group or an ethyl group is preferred and the ethyl group is most preferred. h is preferably 1 or 2 and it is most preferably 2.

As the structural unit (a11), a structural unit represented by a general formula (a1-1-01) or (a1-1-03) shown above yields particularly superior effects for the present invention, and is consequently preferred.

The proportion of the structural unit (a11) within the component (A), relative to the combined total of all the structural units that constitute the component (A), is preferably within a range of 10 to 80 mol %, more preferably from 20 to 70 mol %, even more preferably from 25 to 50 mol %, and most preferably from 30 to 40 mol %. Ensuring that this proportion is at least as large as the lower limit of the above range enables a more favorable pattern to be obtained when the component is used in the positive resist composition, whereas ensuring that the proportion is no greater than the upper limit enables a more favorable balance to be achieved with the other structural units.

Structural Unit (a12)

In addition to the structural unit (a11) described above, the component (A) preferably also includes, as the structural unit (a1), a structural unit (a12) derived from an (α-lower alkyl) acrylate ester that contains a lactone-containing monocyclic or polycyclic group.

The lactone-containing monocyclic or polycyclic group of the structural unit (a12) is effective in improving the adhesion between the resist film and the substrate, and in enhancing the hydrophilicity, thereby improving the affinity with the developing solution, when the component (A) is used in the formation of a resist film.

Here, the term "lactone-containing monocyclic or polycyclic group" refers to a cyclic group that contains a single ring (lactone ring) including a —O—C(O)-structure. Accordingly, the case in which the only ring structure is the lactone ring is referred to as a monocyclic group, and groups containing other ring structures are described as polycyclic groups regardless of the structure of the other rings.

There are no particular restrictions on the structural unit (a12), and any unit that includes both the above type of lactone structure (—O—C(O)—) and a cyclic group can be used.

In the present invention, as the structural unit (a12), a structural unit derived from an (α-lower alkyl)acrylate ester, which has a 5-membered lactone-containing monocyclic ring or polycyclic group as shown in the following general formulas (a2-1) to (a2-5), yields particularly superior effects for the present invention, and is consequently preferred. Such a structural unit can be exemplified by a structural unit represented by the following general formula (2).

[General Formula 21]

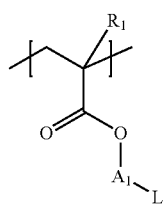

(2)

(wherein, $R_1$ represents a hydrogen atom or a methyl group, $A_1$ represents a divalent or trivalent alicyclic hydrocarbon group having a single bond, single ring, or bridged ring of 5 to 12 carbon atoms, L represents a lactone structure represented by the following general formula (3), and $A_1$ and L are bonded to each other via 1 or 2 linking group(s).)

[General Formula 22]

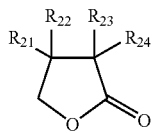
(3)

(wherein, one or two of $R^{21}$ to $R^{24}$ is a linking group with $A_1$ in the general formula (2) and the others represent a hydrogen atom or a methyl group.)

Specific examples of lactone-containing monocyclic groups include groups in which one hydrogen atom has been removed from butyrolactone such as γ-butyrolactone. In the present invention, as the structural unit (a12), at least one selected from the group consisting of structural units represented by the following general formula (a2-1) yields particularly superior effects for the present invention, and is consequently preferred.

[General Formula 23]

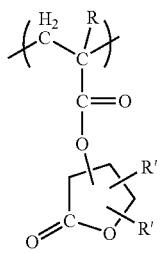
(a2-1)

(wherein, R represents a hydrogen atom or a lower alkyl group and each R' represents, independently, a hydrogen atom, lower alkyl group, or alkoxy group having 1 to 5 carbon atoms.)

For the lower alkyl groups of R and R' in the general formula (a2-1), the same description applies as that used for the lower alkyl group of R in the above structural unit (a11).

In the general formula (a2-1), from the viewpoints of factors such as industrial availability, R' is preferably a hydrogen atom.

Hereinafter, a structural unit represented by the general formula (a2-1) will be exemplified in further details.

[General Formula 24]

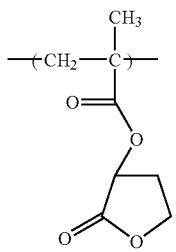
(a2-1-1)

-continued

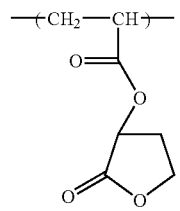
(a2-1-2)

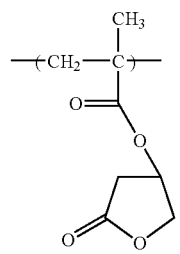
(a2-1-3)

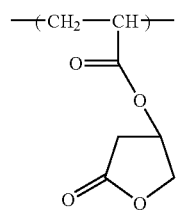
(a2-1-4)

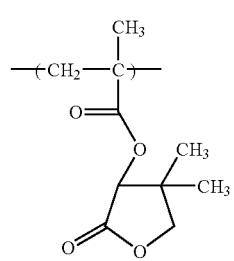
(a2-1-5)

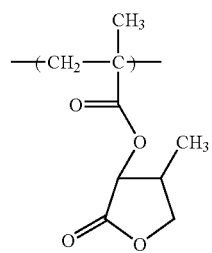
(a2-1-6)

In the present invention, among these, a structural unit represented by a formula (a2-1-1) or (a2-1-2) is preferably used as the structural unit (a 12).

Furthermore, examples of lactone-containing polycyclic groups include groups in which one hydrogen atom has been removed from a lactone ring-containing bicycloalkane, tricycloalkane or tetracycloalkane. Groups in which one hydrogen atom has been removed from a lactone-containing tricycloalkane with the type of structural formula shown below are preferred for reasons such as industrial availability.

[General Formula 25]

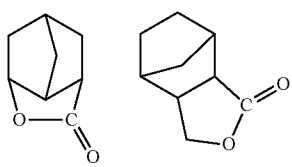

More specific examples of structural units derived from (α-lower alkyl)acrylate esters having lactone-containing polycyclic groups include structural units represented the following general formulas (a2-2) to (a2-5).

[General Formula 26]

(a2-2)
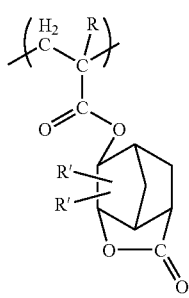

(a2-3)
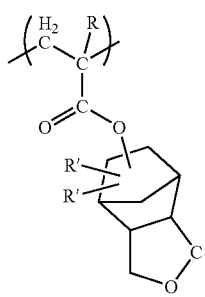

(a2-4)
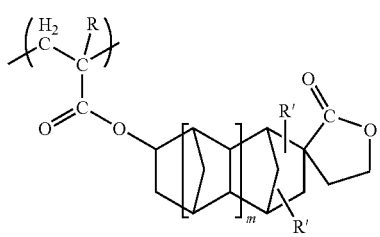

(a2-5)
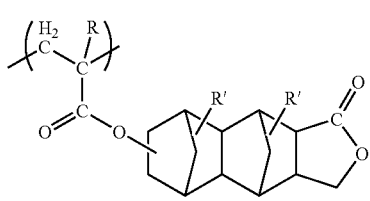

[wherein, R represents a hydrogen atom or a lower alkyl group, R' represents a hydrogen atom, lower alkyl group, or alkoxy group having 1 to 5 carbon atoms, and m represents an integer of either 0 or 1.]

For the R and R' in the general formulas (a2-2) to (a2-5), the same description applies as that used for the R and R' in the above general formula (a2-1).

Hereinafter, structural units represented by the general formulas (a2-2) to (a2-5) will be exemplified in further details.

[General Formula 27]

(a2-2-1)
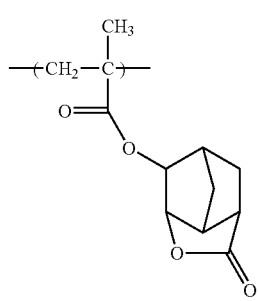

(a2-2-2)
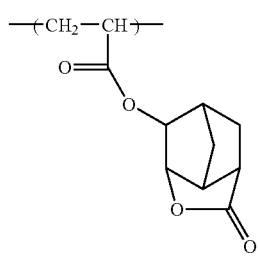

(a2-2-3)
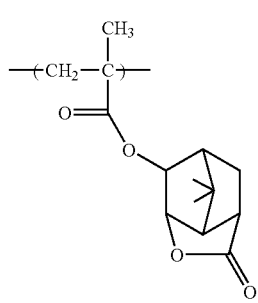

(a2-2-4)
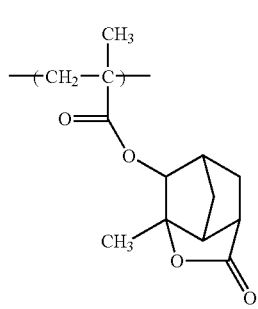

(a2-2-5)
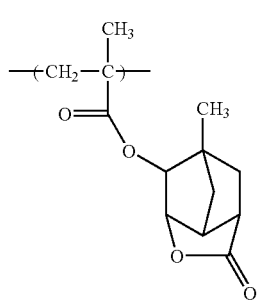

[General Formula 28]
(a2-3-1)
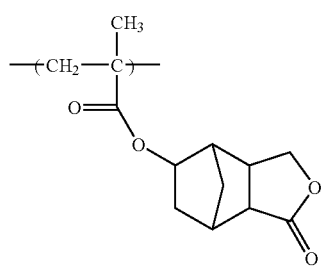
(a2-3-2)
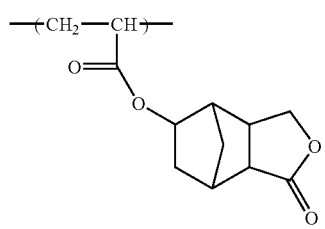
(a2-3-3)
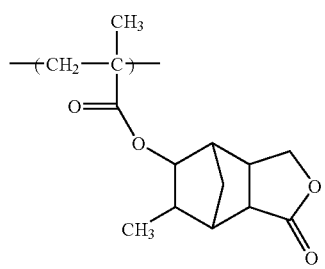
(a2-3-4)
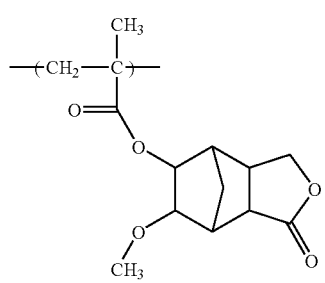
(a2-3-5)
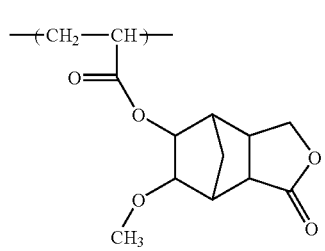
(a2-3-6)
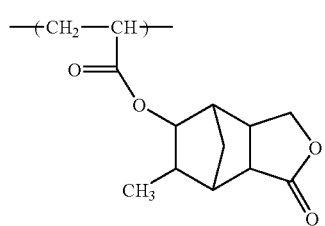
(a2-3-7)
(a2-3-8)
(a2-3-9)
(a2-3-10)
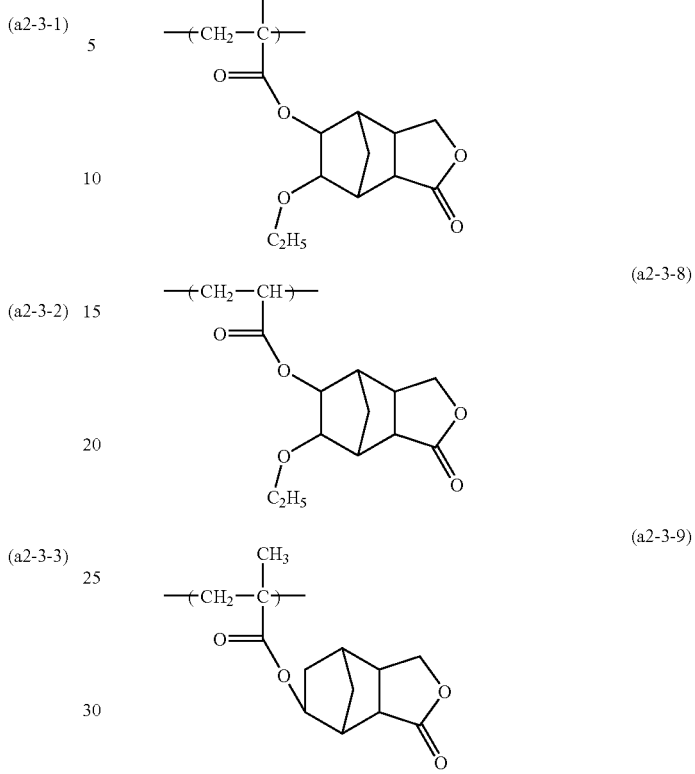
[General Formula 29]
(a2-4-1)
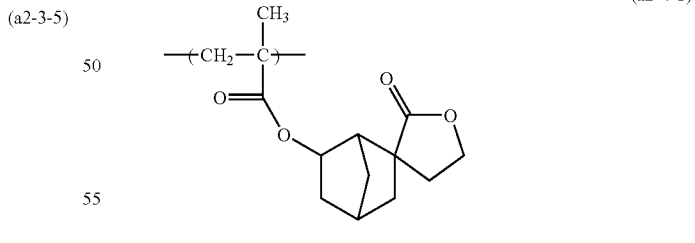
(a2-4-2)
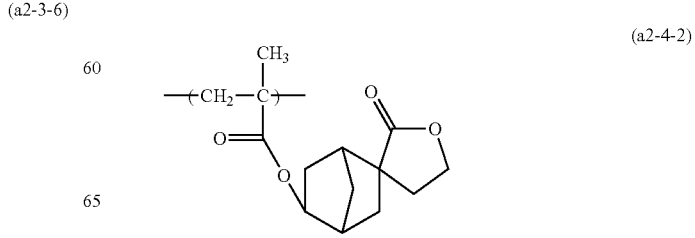

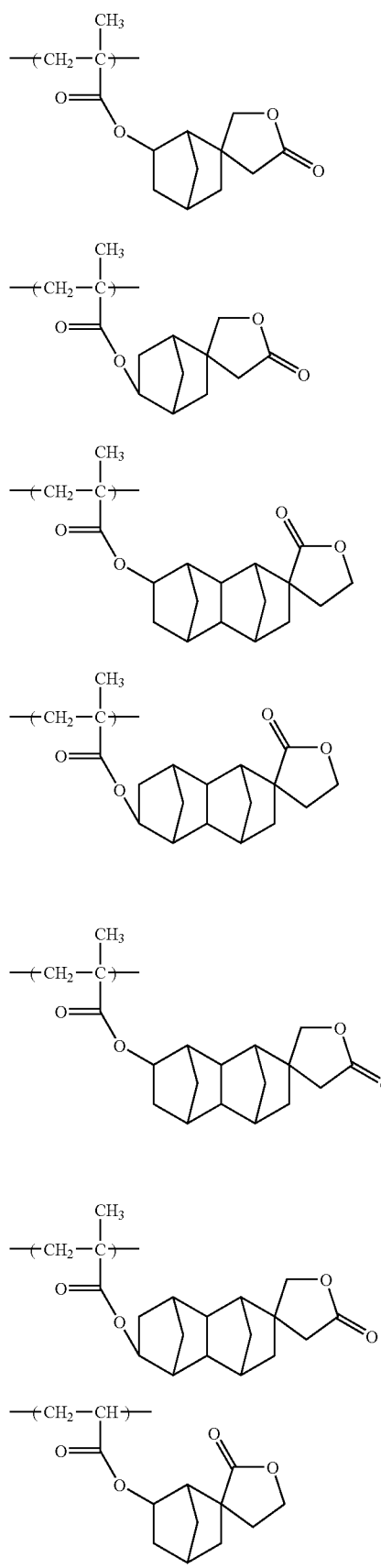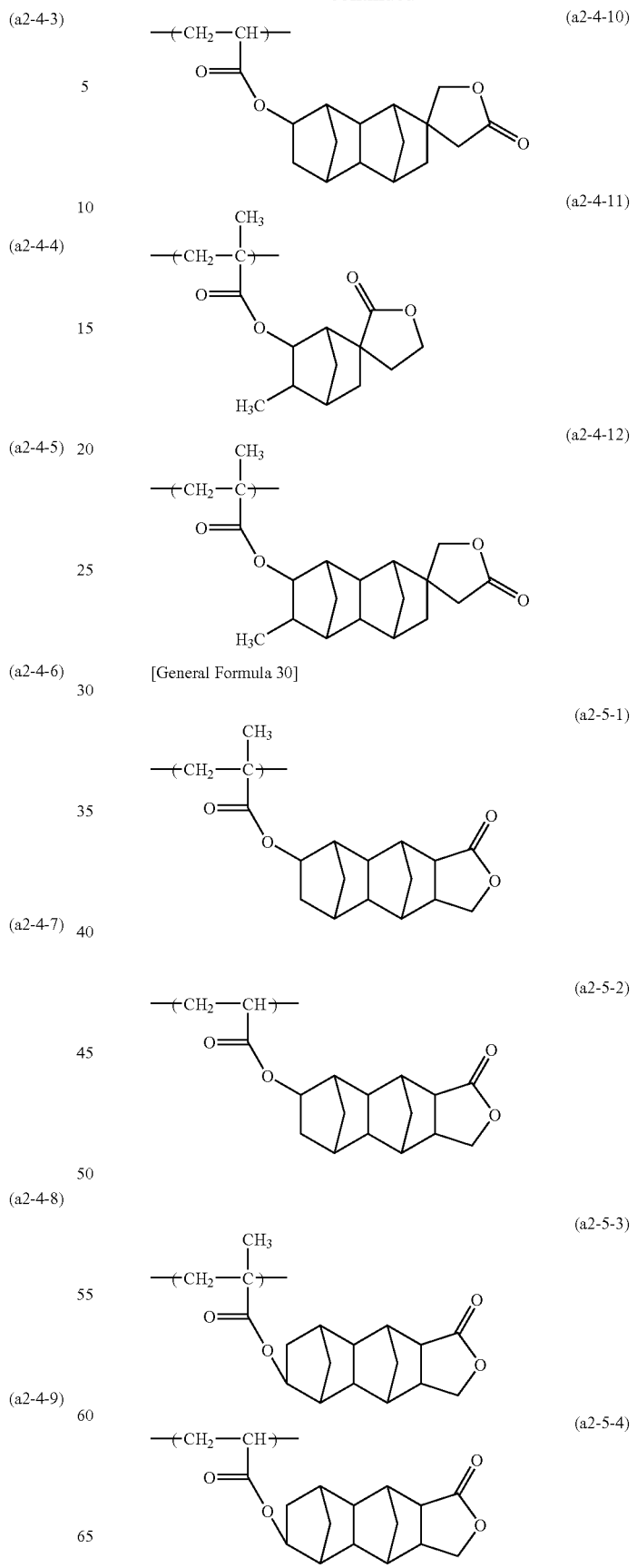

(a2-5-5)

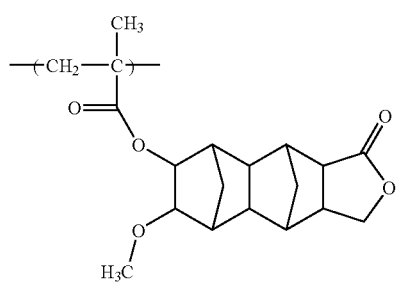

(a2-5-6)

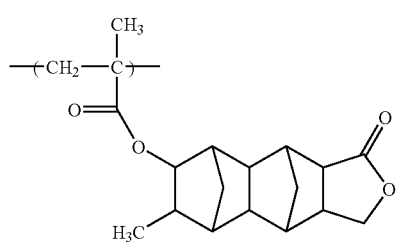

Of these, at least one selected from the group consisting of a structural unit represented by a general formula (a2-2) or (a2-3) is preferably used as a structural unit derived from an (α-lower alkyl)acrylate ester having a lactone-containing polycyclic group. Specifically, at least one selected from the formulas (a2-2-1), (a2-2-2), (a2-3-1), (a2-3-2), (a2-3-9), and (a2-3-10) is used alone or in combinations of two or more.

In the component (A), as the structural unit (a12), either a single type of structural unit may be used alone, or a combination of two or more different structural units may be used.

The proportion of the structural unit (a12) within the component (A), relative to the combined total of all the structural units that constitute the component (A), is preferably within a range of 5 to 60 mol %, more preferably 10 to 50 mol %, even more preferably 20 to 50 mol %, and most preferably 30 to 45 mol %. Ensuring that this proportion is at least as large as the lower limit of the above range enables the effects obtained by including the structural unit (a12) to be more sufficiently realized, whereas ensuring that the proportion is no greater than the upper limit enables a more favorable balance to be achieved with the other structural units.

Structural Unit (a13)

In addition to the structural unit (a11) described above or the structural units (a11) and (a12) described above, the component (A) preferably also includes a structural unit (a13) derived from an (α-lower alkyl)acrylate ester that contains a polar group-containing aliphatic hydrocarbon group. Including the structural unit (a13) enhances the hydrophilicity of the component (A), thereby improving the affinity with the developing solution, improving the alkali solubility within the exposed portions, and contributing to an improvement in the resolution.

Examples of the polar group include a hydroxyl group, a cyano group, a carboxyl group, the hydroxyalkyl group in which a part of a hydrogen atom of an alkyl group is substituted by a fluorine atom, or the like and a hydroxyl group is particularly preferred.

Examples of the aliphatic hydrocarbon group include straight chain or branched hydrocarbon groups (preferably alkylene groups) having 1 to 10 carbon atoms and alicyclic hydrocarbon groups. The polycyclic aliphatic hydrocarbon groups (polycyclic groups) are preferably used as the alicyclic hydrocarbon groups and these polycyclic groups can be selected appropriately from the multitude of groups that have been proposed for the resins of resist compositions designed for use with ArF excimer lasers.

As a structural unit derived from an (α-lower alkyl)acrylate ester having a hydroxyl group-containing aliphatic hydrocarbon group, for example, a structural unit represented by the following general formula (11) can be exemplified.

[General Formula 31]

General Formula (11)

(wherein, $R_1$ represents a hydrogen atom or a methyl group, $A_2$ represents a divalent or trivalent alicyclic hydrocarbon group having a single ring or bridged ring of 6 to 12 carbon atoms, and k represents an integer of 1 to 2.)

Of the various possibilities, structural units that contain aliphatic polycyclic groups having hydroxyalkyl groups of which a part of a hydrogen atom of a hydroxyl group, cyano group, carboxyl group, or alkyl group is substituted by a fluorine atom, and are also derived from an (α-lower alkyl) acrylate ester are particularly preferred. Examples of suitable polycyclic groups include groups in which two or more hydrogen atoms have been removed from a bicycloalkane, tricycloalkane or tetracycloalkane or the like. Specific examples include groups in which two or more hydrogen atoms have been removed from a polycycloalkane such as adamantane, norbornane, isobornane, tricyclodecane or tetracyclododecane. These types of polycyclic groups can be selected appropriately from the multitude of groups proposed for the polymer (resin component) of resist compositions designed for use with ArF excimer lasers. Of these polycyclic groups, groups in which two or more hydrogen atoms have been removed from an adamantyl group, groups in which two or more hydrogen atoms have been removed from norbornyl group, or groups in which two or more hydrogen atoms have been removed from a tetracyclododecanyl group are preferred industrially.

When the hydrocarbon group within the polar group-containing aliphatic hydrocarbon group is a straight chain or branched hydrocarbon group having 1 to 10 carbon atoms, the structural unit (a13) is preferably a structural unit derived from the hydroxyethyl ester of the (α-lower alkyl) acrylic acid, whereas when the hydrocarbon group is a polycyclic group, structural units represented by formulas (a3-1), (a3-2), and (a3-3) shown below are preferred.

In the present invention, as the structural unit (a13), at least one selected from the group consisting of structural units represented by the following general formula (a3-1) yields particularly superior effects for the present invention, and is consequently preferred.

[General Formula 32]

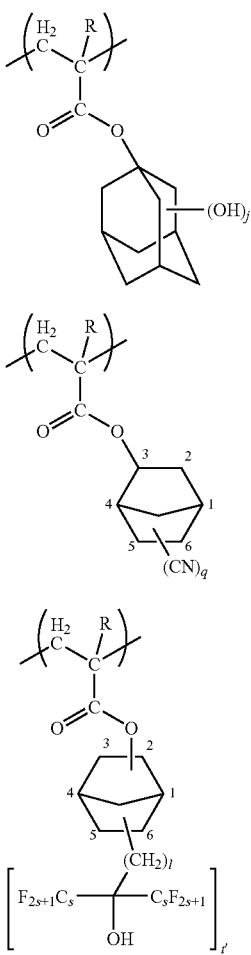

(a3-1)

(a3-2)

(a3-3)

(wherein, R is as defined above, j represents an integer of 1 to 3, q represents an integer of 1 to 3, t' represents an integer of 1 to 3, l represents an integer of 1 to 5, and s represents an integer from 1 to 3.)

In the formula (a3-1), the value of j is preferably 1 or 2, more preferably 1. When the value of j is 2, structural units in which the hydroxyl group is bonded to position 3 and position 5 of the adamantyl group are preferred. When the value of j is 1, structural units in which the hydroxyl group is bonded to position 3 of the adamantyl group are preferred.

In the formula (a3-2), the value of q is preferably 1. The cyano group is preferably bonded to either position 5 or position 6 of the norbornyl group.

In the formula (a3-3), the value t' is preferably 1. The value of l is preferably 1. The value of s is preferably 1. In these structural units, it is preferable that a 2-norbornyl group or 3-norbornyl group be bonded to a terminal of a carboxyl group of an (α-lower alkyl)acrylic acid. It is preferable that a fluorinated alkylalcohol is bonded to the 5-position or 6-position of the norbornyl group.

As the structural unit (a13), either a single type of structural unit may be used alone, or a combination of two or more different structural units may be used.

When the component (A) includes the structural unit (a13), the proportion of the structural unit (a13) within the component (A), relative to the combined total of all the structural units that constitute the component (A), is preferably within a range of 5 to 50 mol %, more preferably 15 to 45 mol %, even more preferably 15 to 35 mol %, and most preferably 15 to 25 mol %.

Structural Unit (a14)

The component (A1) may also include other structural unit (a14) as the structural unit (a1), besides the structural units (a11) to (a13), provided the inclusion of these other units does not impair the effects of the present invention.

As the structural unit (a14), any other structural unit that cannot be classified as one of the above structural units (a11) through (a13) can be used without any particular restrictions, and any of the multitude of conventional structural units used within resist resins for ArF excimer lasers or KrF excimer lasers (and particularly for ArF excimer lasers) can be used.

Preferred examples of the structural unit (a14) include structural units that contain acid non-dissociable aliphatic polycyclic groups and are derived from an (α-lower alkyl) acrylate ester. Examples of this polycyclic group include the same groups as those described above in relation to the aforementioned structural unit (a11), and any of the multitude of conventional polycyclic groups used within the resin component of resist compositions for ArF excimer lasers or KrF excimer lasers (and particularly for ArF excimer lasers) can be used.

In particular, at least one polycyclic group selected from amongst a tricyclodecanyl group, adamantyl group, tetracyclododecanyl group, isobornyl group, and norbornyl group is preferred from the viewpoints of factors such as industrial availability. These polycyclic groups may include a straight chain or branched alkyl group having 1 to 5 carbon atoms as a substituent.

Specific examples of the structural unit (a14) include units with structures represented by the general formulas (a4-1) to (a4-5) shown below.

[General Formula 33]

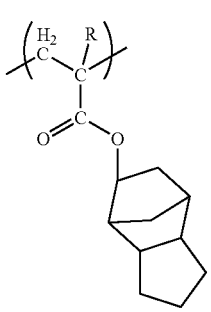

(a4-1)

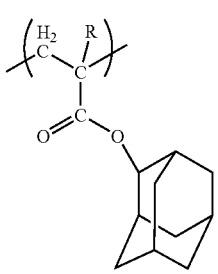

(a4-2)

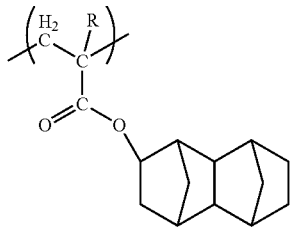
(a4-3)

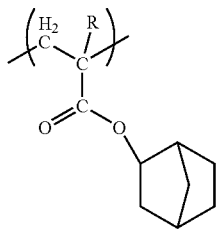
(a4-4)

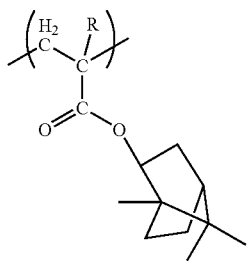
(a4-5)

(wherein R is as defined as above.)

Although the structural unit (a14) is not an essential component of the component (A), if included, the proportion of the structural unit (a14), relative to the combined total of all the structural units that constitute the component (A), is typically within a range of 1 to 30 mol %, and is preferably from 5 to 20 mol %.

In the present invention, those cases in which the component (A) is a copolymer (hereinafter, referred to as a copolymer (A1)) containing all of the structural units (a11), (a12), and (a2) are preferred as they yield superior effects for the present invention and thus are particularly desirable.

As the copolymer (A1), copolymers that include a structural unit represented by the general formula (1) as the structural unit (a11), a structural unit represented by the general formula (2) as the structural unit (a12), and a structural unit represented by the general formula (4) as the structural unit (a2) are particularly preferred.

In the copolymer (A1), it is preferable that the proportion of the structural unit (a11) is within a range of 10 to 60 mol %, the proportion of the structural unit (a12) is within a range of 5 to 60 mol %, the proportion of the structural unit (a13) is within a range of 0 to 40 mol %, and the proportion of the structural unit (a2) is within a range of 1 to 30 mol %, and the structural unit (a11) within a range of 20 to 50 mol %, the structural unit (a12) within a range of 20 to 60 mol %, the structural unit (a13) within a range of 5 to 35 mol %, and the structural unit (a2) within a range of 2 to 20 mol % are particularly preferred.

In the present invention, it is particularly preferable that the component (A) be a ternary copolymer consisting of the structural units (a11), (a12), and (a2) or a quaternary copolymer consisting of the structural units (a11), (a12), (a13), and (a2).

Although there are no particular restrictions on the weight average molecular weight (Mw) (the polystyrene equivalent value determined by gel permeation chromatography (GPC)) of the component (A), values within a range from 2,000 to 40,000, preferably from 3,000 to 30,000, and even more preferably from 4,000 to 25,000 are the most desirable. When the values are no greater than the upper limit, solubility to a resist solvent sufficient for using as the resist can be provided and when the values are greater than the lower limit, a suitable dry etching resistance and cross-sectional profile of the resist pattern can be obtained.

Furthermore, the dispersity (Mw/Mn) is preferably within a range of 1.0 to 5.0, more preferably 1.0 to 3.0 and most preferably 1.2 to 2.5.

The component (A) can be obtained, for example, by a preparation method used for preparing polymers in general, for example, by a known polymerization method such as a radical polymerization or the like, except that acid is used in the preparation process. In this case, the acid may be added while polymerizing monomers or added after finishing the polymerization reaction.

In the present invention, as the polymerization process, there is preferably employed a solution polymerization process which includes dissolving at least one monomer and a polymerization initiator in a solvent; adding to a polymerization solvent; and subjecting the monomer to a radical polymerization at a predetermined polymerization temperature.

Furthermore, a chain transfer agent such as HS—$CH_2$—$CH_2$—$CH_2$—$C(CF_3)_2$—OH may be employed during the polymerization. Accordingly, —$C(CF_3)_2$—OH group is introduced to the terminal of the copolymer (A). That is, a copolymer in which a hydroxyalky group having an alkyl group of which the moiety is substituted by a fluorine atom is effective in reduction of defects and reduction of LER (Line Edge Roughness).

There are no particular restrictions on these polymerization initiators as long as they are generally used as a radical generator and, for example, azo compounds such as 2,2'-azobisisobutyronitrile, 2,2'-azobis(2-methyl butyronitrile), dimethyl-2,2'-azobisisobutylate, 1,1'-azobis(cyclohexane-1-carbonitrile), 4,4'-azobis(4-cyanovaleric acid) and the like; and organic peroxides such as decanoylperoxide, lauroylperoxide, benzoylperoxide, bis(3,5,5-trimethylhexanoyl)peroxide, succinate peroxide, tert-butylperoxy-2-ethylhexanoate, tert-butylperoxypivalate, 1,1,3,3-tertramethyl butylperoxy-2-ethylhexanoate, and the like may be used alone or in combinations.

The amount of the polymerization initiator can be selected depending on conditions such as a targeted Mw, monomers, polymerization initiator, chain transfer agent, solvents, composition, polymerization temperature, and loading speed.

As for the chain transfer agent, for example, known thiol compounds such as dodecanthiol, mercaptoethanol, mercaptopropanol, mercaptoacetate, mercaptopropionate, and the like may be used alone or in combination.

The amount of the chain transfer agent can be selected depending on conditions such as a targeted Mw, monomers, polymerization initiator, chain transfer agent, solvents, composition, polymerization temperature, and loading speed.

As the polymerization solvent, monomers, polymerization initiators, chain transfer agents, and solvents for dissolving copolymers thus polymerized can be preferably used. Examples thereof include ketones such as acetone, methylethylketone, methylamylketone, cyclohexanone, and the like; ethers such as tetrahydrofurane, dioxane, glyme, propylene glycol monomethyl ether, and the like; esters such as ethyl acetate, ethyl lactate, and the like; ether esters such as propylene glycol methylether acetate and the like; and lactones such as γ-butylolactone and the like and these may be used alone or in combination.

Here, the acid used for the preparation of the component (A) is defined by an acid which is not polymerizable to monomers used in preparation of copolymers and is capable of dissociating at least a part of the ester terminal of (α-lower alkyl)acrylate ester (X in the general formula (a-1). For example, the acid dissociable dissolution inhibiting group of the structural unit (a11)).

In the present invention, as the acid, strong acids having pKa of 2.0 or less in aqueous solution at 25° C. are preferably used. More preferably strong acids having pKa of 1.0 or less and particularly preferably strong acids having pKa of 0.5 or less are used. Specific examples of strong acids include perfluorocarboxylates such as fluoroacetate; organic sulfonates such as trifluoromethane sulfonate, methanesulfonate, p-toluene sulfonate and hydrates thereof, benzene sulfonate and hydrates thereof, and the like; and sulfuric acid, hydrochloric acid, nitric acid, perchloric acid, hydrobromic acid and the like. These strong acids may be in combination of two or more different kinds. Of these, sulfuric acid yields excellent effects of the present invention and thus it is most preferable.

A method of adding the acid is not particularly limited and, for example, the amount of the acid added when polymerizing monomers can be appropriately selected depending on a targeted proportion of the structural unit (a2), a structure of the ester terminal of (α-lower alkyl)acrylate ester to be used, and kinds of acids to be used.

For example, when dissolving a monomer in a solvent with a polymerization initiator and polymerizing the monomer in a solution, it is preferable to add the acid in a concentration of 0.1 to 1,000 ppm, more preferably 1 to 500 ppm, particularly preferably 5 to 300 ppm, and most preferably 5 to 50 ppm.

Hereinafter, a preferred mode of a preparation method of the component (A) according to the present invention will be described.

In the present embodiment, the component (A) can be obtained by a process (P) and at least one of a process (Q-1) and a process (Q-2) (hereinafter, the process (Q-1) and the process (Q-2) may be referred to as a process (Q)).

Process (P): a process for polymerizing a monomer containing at least one (α-lower alkyl)acrylate ester, thereby obtaining a polymer having a structural unit (a1) derived from at least one (α-lower alkyl)acrylate ester.

Process (Q-1): a process for dissociating an ester terminal of an (α-lower alkyl)acrylate ester under the action of acid, thereby preparing an (α-lower alkyl)acrylic acid.

Process (Q-2): a process for dissociating an ester terminal of a structural unit (a1) derived from an (α-lower alkyl)acrylate ester under the action of acid, thereby preparing a structural unit (a2) derived from an (α-lower alkyl)acrylic acid.

The process (P) may be performed by conducting a radical polymerization (solution polymerization) in a polymerization solvent and the method can be selected amongst known methods without a limit. Examples of the method include (1) a bulk polymerization which includes dissolving a monomer in a solvent with a polymerization initiator and heating the mixture for polymerization; (2) a dropping method which includes dissolving a monomer in a solvent with a polymerization initiator, if needed, and dropping the mixture in a heated solvent for polymerization; (3) an individual dropping method which includes individually dissolving a monomer and a polymerization initiator, if needed, in a solvent and individually dropping the solutions in heated solvents for polymerization; (4) an initiator-dropping method which includes dissolving a monomer in a solvent and heating the resultant, and dropping a polymerization initiator separately dissolved in a solvent for polymerization; and the like. The individual dropping polymerization method (3) is particularly preferred.

In the process (P), a chain transfer agent may be used as described above.

In the dropping methods described in (2) to (4), drops may be a mixture including a monomer, a mixture including a polymerization initiator, or a solution prepared by dissolving into a solvent to be heated in advance.

Furthermore, in the dropping methods, a dropping time, a composition of a monomer to be dropped, and a proportion of a monomer, a polymerization initiator, and a chain transfer agent may be varied.

The polymerization temperature can be appropriately selected depending on a solvent, a monomer, a viscosity of a chain transfer agent. Since the polymerization is hardly conducted at lower temperature, there arises a problem in productivity. When the polymerization is conducted at a temperature higher than expected, there arises a problem in a stability of a monomer and a thus obtained copolymer. Therefore, the temperature is preferably selected in a range of 40 to 120° C., particularly preferably 60 to 100° C.

When the dropping in the dropping method is performed over a short period of time, a molecular weight distribution tends to increase and also a temperature of the polymerization solution decreases due to a large quantity of solution dripping and thus is not preferable. When the dropping is performed over a long period of time, heat over the requirement for a copolymer is generated and also the productivity is lowered and thus is not preferable. Therefore, it is selected within a range of generally 30 minutes to 24 hours, preferably 1 hour to 12 hours, particularly preferably 2 hours to 8 hours.

After the dropwise addition in the dropping method and after the elevation of the temperature to a polymerization temperature in the bulk method, the temperature is preferably maintained over a defined period of time or increased to allow ageing, thereby bringing the remaining unreacted monomer to a reaction. When the ageing is performed over a long period of time, a production efficiency per time is lowered and also heat over the requirement for a copolymer is generated, and thus is not preferable. Therefore, it is selected within a range of generally no more than 12 hours, preferably no more than 6 hours, particularly preferably 1 to 4 hours.

In the process (P), it is particularly preferable to copolymerize at least two kinds or more of monomers that include an (α-lower alkyl)acrylate ester having an acid dissociable dissolution inhibiting group and an (α-lower alkyl)acrylate ester having a lactone-containing monocyclic or polycyclic group. It is particularly preferable to copolymerize an (α-lower alkyl)acrylate ester having an acid dissociable dissolution inhibiting group, an (α-lower alkyl)acrylate ester having a lactone-containing monocyclic or polycyclic group, and an (α-lower alkyl)acrylate ester having a polar group-containing aliphatic hydrocarbon group.

The process (Q) may be performed with the process (P) and may be performed after the process (P).

Here, "performed with" refers to a polymerization of a monomer under the presence of acid and "performed after the process (P)" refers to the addition of acid after stopping the polymerization reaction.

When the process (Q) is performed with the process (P), the process (P), the process (Q-1), and the process (A-2) may be performed at the same time. That is, by adding acid during the polymerization reaction of the (α-lower alkyl)acrylate ester added as the monomer, dissociation of the ester terminal of the (α-lower alkyl)acrylate ester and dissociation of the ester terminal of the structural unit (a1) in the thus prepared polymer are performed with the polymerization of the monomer.

In this case, the acid may coexist with a solvent before the polymerization, a monomer, a polymerization initiator, or a chain transfer agent, may be used alone during the polymerization, or may be supplied with the solvent, the monomer, the polymerization initiator, and the chain transfer agent.

The acid may be added at any time of before the heating, during the dropwise addition, during the ageing, and after the ageing to the completion of the reaction.

When the process (Q) is performed after the process (P), the process (Q-2) is only performed as the process (Q).

When performing the process (Q) after the process (P), it may be processed by, either continuously to the termination of the process (P) or after carrying out a purification process for removing impurities such as unreacted monomer after the process (P), applying heat in the presence of acid.

The kinds and concentrations of acid to be used in the process (Q) are as defined above.

The reaction temperature or the time can be appropriately selected depending on a targeted proportion of the structural unit (a2), acid to be used, or kinds of the (α-lower alkyl) acrylic acid and ester terminal of the (α-lower alkyl)acrylate ester. The reaction temperature is generally 40° C. or higher and is preferably the polymerization temperature described in the process (P). The reaction is performed for 30 minutes or more, preferably 1 hour or more.

Since the copolymer obtained by the process (P), or the process (P) and the process (Q) contains impurities such as unreacted monomers, low molecular weight components such as oligomers, a polymerization initiator, a chain transfer agent and its reaction residuals, acid used in the process (Q), it is preferable to perform a process (R) for purifying the copolymer obtained by the process (P), or the process (P) and the process (Q).

Examples of the purification method include the following (R-1), (R-1a), (R-1b), (R-2), and (R-2a).

(R-1): a method of adding a hollow solvent to precipitate the copolymer, and then separating a solvent phase.

(R-1a): a method of adding a hollow solvent followed by (R-1), washing the copolymer, and then separating a solvent phase.

(R-1b): a method of adding a good solvent followed by (R-1), re-dissolving the copolymer, adding a hollow solvent to re-precipitate the copolymer, and then separating a solvent phase.

(R-2): a method adding a hollow solvent to form a two-phase a hollow solvent phase and a good solvent phase and then separating a hollow solvent phase.

(R-2a): a method of adding a good solvent followed by (R-2), washing a good solvent phase, and then separating a hollow solvent phase.

Any one of methods may be used once or may be repeated, and these methods may be used in combinations of two or more kinds.

The hollow solvents are not particularly limited as long as they hardly dissociate the copolymer but examples thereof include water; alcohols such as methanol, isoprophanol, and the like; saturated hydrocarbons such as hexane, heptanes, and the like; and the like.

The good solvent is not particularly limited as long as it easily dissociates the copolymer but the same solvent as the polymerization solvent is preferred from the viewpoint of controlling of the production process.

When the process (R) is performed after the process (Q), the following methods (R-3) and (R-4) are performed so as to remove the acid used in the process (Q).

(R-3): a method of neutralizing an acid by alkalis, such as an amine.

(R-4): a method of adhering an acid to a basic ion exchange resin or the like.

Any one of methods may be used once or may be repeated, and these methods may be used in combinations of two or more kinds. Further, these methods may be incorporated with the methods (R-1), (R-1a), (R-1b), (R-2), and (R-2a).

When the acid used in the process (Q) is not used in the method (R-1) or the method (R-2), water or alcohols such as methanol or isoprophanol are preferably used.

Since the copolymer after the purification contains the solvent used for the purification, the copolymer can be made as a resist solution by, after being dried under a reduced pressure, either dissolving in an organic solvent (resist solvent) described later; or dissolving in a good solvent such as a resist solvent or a polymerization solvent and then distilling off substances having a low-boiling point other than the resist solvent under reduced pressure while supplying a resist solvent if necessary to perform a solvent substitution.

The temperature of the drying under reduced pressure and the solvent substitution is not particularly limited as long as it does not deteriorate the copolymer but it is generally 100° C. or lower, preferably 80° C. or lower, particularly preferably 70° C. or lower.

When too smaller amount of the resist solvent is used in the solvent substitution, the compounds having a low-boiling point are not sufficiently removed. When too large an amount of the solvent is used, it takes too much time for the solvent substitution, and heat over the requirement for a copolymer is generated and thus is not preferable. The amount may be in the range of 1.05- to 10-times, preferably 1.1- to 5-times, and particularly preferably 1.2- to 3-times the amount of the solvent in the end solution.

<Component (B)>

As a component (B), a component can be appropriately selected from known materials used as acid generators in conventional chemically amplified resists. Examples of these acid generators are numerous, and include onium salt-based acid generators such as iodonium salts and sulfonium salts, oxime sulfonate-based acid generators, diazomethane-based acid generators such as bisalkyl or bisaryl sulfonyl diazomethanes and poly(bis-sulfonyl)diazomethanes, nitrobenzyl sulfonate-based acid generators, iminosulfonate-based acid generators, and disulfone-based acid generators.

As the onium salt-based acid generators, the compounds represented by the following general formula (b-1) or (b-2) can be used.

[General Formula 34]

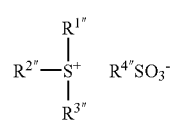

(b-1)

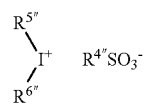

(b-2)

[wherein, $R^{1''}$ to $R^{3''}$ and $R^{5''}$ to $R^{6''}$ each represents, independently, an aryl group or an alkyl group; $R^{4''}$ represents a straight chain, branched or cyclic alkyl group or a fluorinated alkyl group; at least one of $R^{1''}$ to $R^{3''}$ represents an aryl group; and at least one of $R^{5''}$ to $R^{6''}$ represents an aryl group.]

In formula (b-1), $R^{1''}$ to $R^{3''}$ each represents, independently, an aryl group or an alkyl group; at least one of $R^{1''}$ to $R^{3''}$ represents an aryl group; two or more of $R^{1''}$ to $R^{3''}$ represent an aryl group; and all of $R^{1''}$ to $R^{3''}$ represent most preferably an aryl group.]

The aryl group of $R^{1''}$ to $R^{3''}$ is not particularly limited and the aryl group is, for example, an aryl group having 6 to 20 carbon atoms. This aryl group may include a hydrogen atom of which a part or all is substituted by an alkyl group, alkoxy group, halogen atom, or the like. Since the aryl group may be synthesized at low cost, an aryl group having 6 to 10 carbon atoms is preferred. Specific examples include a phenyl group, a naphthyl group, and the like.

Preferred examples of the alkyl group of which hydrogen atom of the aryl group may be substituted include an alkyl group having 1 to 5 carbon atoms and most preferable examples thereof include a methyl group, an ethyl group, a propyl group, a n-butyl group, a tert-butyl group, and the like.

Preferred examples of the alkoxy group of which hydrogen atom of the aryl group may be substituted include an alkoxy group having 1 to 5 carbon atoms and most preferable examples thereof include a methoxy group and an ethoxy group.

As the halogen atom of which the halogen atom of the aryl group may be substituted, a fluorine atom is preferred.

The alkyl group of $R^{1''}$ to $R^{3''}$ is not particularly limited and preferred examples thereof include a straight chain, branched, or cyclic alkyl group having 1 to 10 carbon atoms. The alkyl group having 1 to 5 carbon atoms is preferred from the viewpoint of excellent resolution. Specific examples thereof include a methyl group, an ethyl group, an n-propyl group, an isopropyl group, an n-butyl group, an isobutyl group, an n-pentyl group, a cyclopentyl group, a hexyl group, a cyclohexyl group, a nonyl group, a decanyl group, and the like. The methyl group is preferred from the viewpoint of exhibiting an excellent resolution and capable of synthesizing at low cost.

Of these, all of $R^{1''}$ to $R^{3''}$ are most preferably the phenyl group.

$R^{4''}$ represents a straight chain, branched, or cyclic alkyl group or a fluorinated alkyl group.

As the straight chain or branched alkyl group, a group having 1 to 10 carbon atoms is preferred, a group having 1 to 8 carbon atoms is more preferred, and a group having 1 to 4 carbon atoms is most preferred.

As the cyclic alkyl group, a group represented by the $R^{1''}$ and having 4 to 15 carbon atoms is preferred, a group having 4 to 10 carbon atoms is more preferred, and a group having 6 to 10 carbon atoms is most preferred.

As the fluorinated alkyl group, a group having 1 to 10 carbon atoms is preferred, a group having 1 to 8 carbon atoms is more preferred, and a group having 1 to 4 carbon atoms is most preferred. In addition, the fluorination ratio of the fluorinated alkyl group (proportion of the fluorine atom in the alkyl group) is preferably 10 to 100%, more preferably 50 to 100%. When all of the hydrogen atoms are substituted by fluorine atoms, the strength of the acid becomes stronger and thus it is preferable.

As the $R^{4''}$, a straight chain or cyclic alkyl group, or a fluorinated alkyl group is most preferable.

In the formula (b-2), $R^{5''}$ to $R^{6''}$ each represents, independently, an aryl group or an alkyl group; at least one of $R^{5''}$ to $R^{6''}$ represents an aryl group; and all of $R^{5''}$ to $R^{6''}$ is preferably an aryl group.

The aryl group of $R^{5''}$ to $R^{6''}$ is the same as the aryl group of $R^{1''}$ to $R^{3''}$.

The alkyl group of $R^{5''}$ to $R^{6''}$ is the same as the alkyl group of $R^{1''}$ to $R^{3''}$.

Of these, $R^{5''}$ to $R^{6''}$ is preferably all phenyl groups.

The $R^{4''}$ in the formula (b-2) is the same as the $R^{4''}$ in the formula (b-1).

Specific examples of the onium salt-based acid generator include trifluoromethanesulfonate or nonafluorobutanesulfonate of diphenyliodonium, trifluoromethanesulfonate or nonafluorobutane sulfonate of bis(4-tert-butylphenyl)iodonium; trifluoromethanesulfonate, heptafluoropropanesulfonate, or nonafluorobutanesulfonate of triphenyl sulfonium; trifluoromethanesulfonate, heptafluoropropanesulfonate, or nonafluorobutanesulfonate of tri(4-methylphenyl)sulfonium; trifluoromethanesulfonate, heptafluoropropanesulfonate or nonafluorobutanesulfonate of dimethyl(4-hydroxynaphthyl)sulfonium; trifluoromethanesulfonate, heptafluoropropanesulfonate, or nonafluorobutanesulfonate of monophenyldimethylsulfonium; trifluoromethanesulfonate, heptafluoropropanesulfonate, or nonafluorobutanesulfonate of diphenylmonomethylsulfonium; trifluoromethanesulfonate, heptafluoropropanesulfonate or nonafluorobutanesulfonate of (4-methylphenyl)diphenylsulfonium; trifluoromethanesulfonate, heptafluoropropanesulfonate or nonafluorobutane sulfonate of (4-methoxyphenyl)diphenyl sulfonium; trifluoromethanesulfonate, heptafluoropropanesulfonate or nonafluorobutanesulfonate of tri(4-tert-butyl)phenylsulfonium; trifluoromethanesulfonate, heptafluoropropanesulfonate or nonafluorobutanesulfonate of diphenyl(1-4-methoxy)naphthyl)sulfonium; and the like. Onium salts in which an anion moiety of these onium salts is substituted by methanesulfonate, n-propanesulfonate, n-butanesulfonate, and n-octanesulfonate may be used.

Moreover, in the formula (b-1) or (b-2), there may be used onium salts in which an anion moiety is substituted by an anion moiety represented by the following general formula (b-3) or (b-4) (cation moiety is the same as that of (b-1) or (b-2)).

[General Formula 35]

(b-3)

(b-4)

[wherein, X'' represents an alkylene group having 2 to 6 carbon atoms in which at least one hydrogen atom is substituted by a fluorine atom; and Y'' and Z'' each represents, independently, an alkylene group having 1 to 10 carbon atoms in which at least one hydrogen atom is substituted by a fluorine atom.]

X'' represents a straight chain or branched alkylene group in which at least one hydrogen atom is substituted by a fluorine atom and the alkylene group includes 2 to 6 carbon atoms, preferably 3 to 5 carbon atoms, most preferably 3 carbon atoms.

Y" and Z" each represents, independently, a straight chain or branched alkyl group in which at least one hydrogen atom is substituted by a fluorine atom and the alkyl group includes 1 to 10 carbon atoms, preferably 1 to 7 carbon atoms, most preferably 1 to 3 carbon atoms.

The number of carbon atoms of the alkylene group for X" or the alkyl group for X" and Z" as in the ranges above is preferred to be smaller because of a suitable solubility to the resist solvent.

Moreover, in the alkylene group for X" or the alkyl group for Y" and Z", as the number of hydrogen atoms substituted by fluorine atoms gets large, stronger acidity is obtained, transparency to high energy light of 200 nm or less or electron ray improves, and thus is preferable. The proportion of the fluorine atom in the alkylene group or the alkyl group is preferably 70 to 100%, more preferably 90 to 100%, and a perfluoroalkylene group or a perfloroalkyl group in which all hydrogen atoms are substituted by fluorine atoms is particularly preferred.

In the present invention, the oxime sulfonate-based acid generator is a compound having at least one group represented by the following general formula (B-1) and generates acid upon exposure to radiation. Such an oxime sulfonate-based acid generator is generally used for the chemically amplified resist composition and any of the multitude of general acid generators can be used.

[General Formula 36]

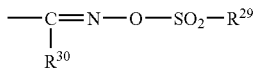

(B-1)

(in the formula (B-1), $R^{29}$ and $R^{30}$ each represents, independently, an organic group.)

In the present invention, the 'organic group' includes carbon atoms and may include other atoms different from carbon atoms (for example, a hydrogen atom, an oxygen atom, a nitrogen atom, a sulfur atom, a halogen atom (such as a fluorine atom and a chlorine atom) and the like).

As the organic group of $R^{29}$, a straight chain, branched, or cyclic alkyl group or aryl group is preferred. The alkyl group and the aryl group may include a substituent. The substituent is not particularly limited and examples thereof include a fluorine atom and a straight chain, branched, or cyclic alkyl group having 1 to 6 carbon atoms. Here, 'having a substituent' refers to an alkyl group or an aryl group of which a part or all of hydrogen atoms is substituted by a substituent.

The alkyl group having preferably 1 to 20 carbon atoms, more preferably 1 to 10 carbon atoms, even more preferably 1 to 8 carbon atoms, particularly preferably 1 to 6 carbon atoms, and most preferably 1 to 4 carbon atoms is preferred. As the alkyl group, in particular, a partially or totally halogenated alkyl group (hereinafter, sometimes referred to as a halogenated alkyl group) is preferred. The partially halogenated alkyl group refers to an alkyl group of which a part of hydrogen atoms is substituted by a halogen atom and the totally halogenated alkyl group refers to an alkyl group of which all of hydrogen atoms are substituted by a halogen atom. Examples of the halogen atom include a fluorine atom, a chlorine atom, a bromine atom, an iodine atom, and the like, and the fluorine atom is particularly preferred. That is, the halogenated alkyl group is preferably the fluorinated alkyl group.

The aryl group having preferably 4 to 20 carbon atoms, more preferably 4 to 10 carbon atoms, and most preferably 6 to 10 carbon atoms is preferred. As the aryl group, in particular, a partially or totally halogenated aryl group is preferred. The partially halogenated aryl group refers to an aryl group of which a part of hydrogen atoms is substituted by a halogen atom and the totally halogenated aryl group refers to an aryl group of which all of hydrogen atoms are substituted by a halogen atom.

As $R^{29}$, an alkyl group having 1 to 4 carbon atoms that does not include a substituent or a fluorinated alkyl group having 1 to 4 carbon atoms is particularly preferred.

As the organic group of $R^{30}$, a straight chain, branched, or cyclic alkyl group, aryl group, or cyano group is preferred. Examples of the alkyl group and the aryl group of $R^{30}$ are the same as that of the alkyl group and the aryl group of $R^{29}$.

As $R^{30}$, an alkyl group having 1 to 8 carbon atoms that does not include a substituent or a fluorinated alkyl group having 1 to 8 carbon atoms is particularly preferred.

Preferred examples of the oxime sulfonate-based acid generator include the compounds represented by the following general formula (B-2) or (B-3).

[General Formula 37]

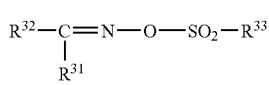

(B-2)

[In the formula (B-2), $R^{31}$ is a cyano group, an alkyl group not having a substituent, or a halogenated alkyl group. $R^{32}$ is an aryl group. $R^{33}$ is an alkyl group not having a substituent or a halogenated alkyl group.]

[General Formula 38]

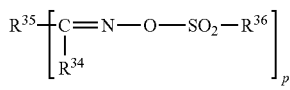

(B-3)

[In the formula (B-3), $R^{34}$ is a cyano group, an alkyl group not having a substituent, or a halogenated alkyl group. $R^{35}$ is a divalent or trivalent aromatic hydrocarbon group. $R^{36}$ is an alkyl group not having a substituent or a halogenated alkyl group. p is 2 or 3.]

In the general formula (B-2), the alkyl group not having a substituent or the halogenated alkyl group of $R^{31}$ has preferably 1 to 10 carbon atoms, more preferably 1 to 8 carbon atoms, most preferably 1 to 6 carbon atoms.

As for the $R^{31}$, a halogenated alkyl group is preferred and a fluorinated alkyl group is more preferred.

In the fluorinated alkyl group $R^{31}$, 50% or more of hydrogen atoms of an alkyl group is preferably fluorinated, more preferably 70% or more, even more preferably 90% or more.

Examples of the aryl group of $R^{32}$ include groups in which one hydrogen atom has been removed from an aromatic hydrocarbon ring such as a phenyl group, a biphenyl group, a fluorenyl group, a naphthyl group, an anthracyl group, and a phenanthryl group, and heteroaryl groups in which a part of carbon atoms constituting rings of these group is substituted by hetero atoms such as an oxygen atom, a sulfur atom, and a nitrogen atom. Of these, a fluorenyl group is preferred.

The aryl group of $R^{32}$ may include a substituent such as an alkyl group having 1 to 10 carbon atoms, a halogenated alkyl group, and alkoxy group. The alkyl group and the halogenated alkyl group serving as the substituent has preferably 1 to 8 carbon atoms, more preferably 1 to 4 carbon atoms. The halogenated alkyl group thereof is preferably a fluorinated alkyl group.

The alkyl group not having a substituent or the halogenated alkyl group of $R^{33}$ has preferably 1 to 10 carbon atoms, more preferably 1 to 8 carbon atoms, most preferably 1 to 6 carbon atoms.

As for the $R^{33}$, a halogenated alkyl group is preferred, a fluorinated alkyl group is more preferred, and a partially fluorinated alkyl group is most preferred.

In the fluorinated alkyl group $R^{33}$, 50% or more of hydrogen atoms of an alkyl group is preferably fluorinated, more preferably 70% or more, even more preferably 90% or more, since it enhances the stretch of the acid to be generated. A totally fluorinated alkyl group of which 100% of hydrogen atoms are substituted by a fluorine atom is most preferred.

In the general formula (B-3), the alkyl group not having a substituent and the halogenated alkyl group of $R^{34}$ is the same as the alkyl group not having a substituent and the halogenated alkyl group of $R^{31}$.

Examples of the divalent or trivalent aromatic hydrocarbon group of $R^{35}$ include groups in which one or two hydrocarbon atoms have been removed from the aryl group of $R^{32}$.

As for the alkyl group not having a substituent or the halogenated alkyl group of $R^{36}$, the same one as the alkyl group not having a substituent or the halogenated alkyl group of $R^{33}$ can be used.

p is preferably 2.

Specific examples of suitable oxime sulfonate-based acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino) cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexyl sulfonyloxyimino)-1-cyclopentenyl acetonitrile, (α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Further, compounds represented by the following general formula (i) can be mentioned.

[General Formula 39]

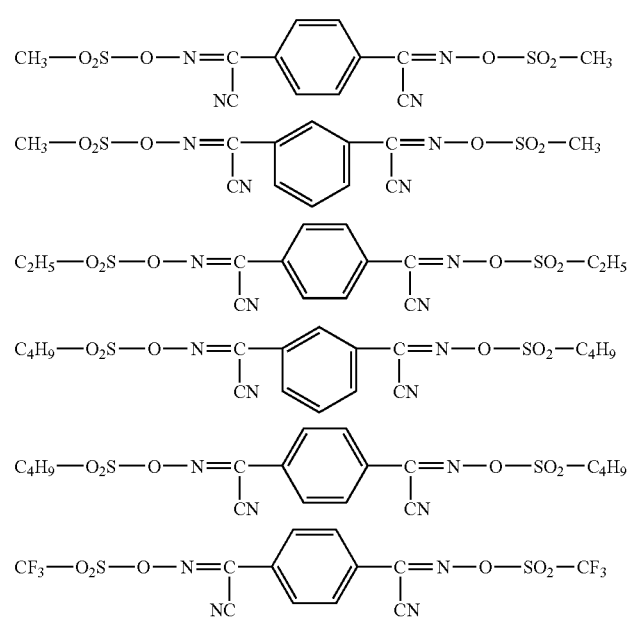

(i)

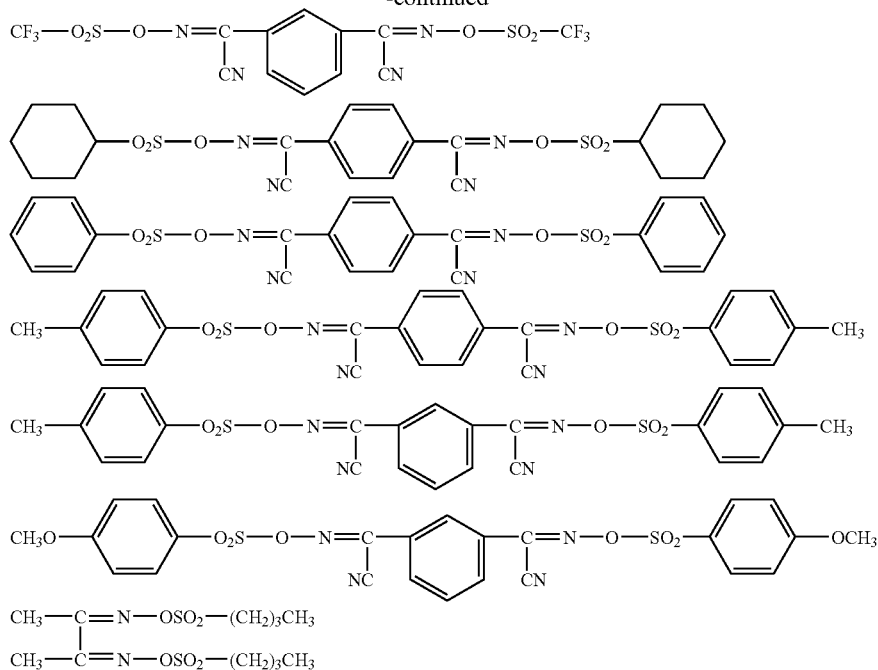
Preferred examples of compounds amongst the compounds represented by the general formula (B-2) or (B-3) are represented by the following general formulas (ii) and (iii).
[General Formula 40]
(ii)
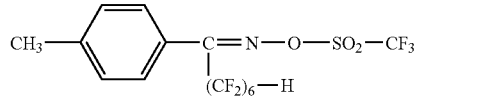
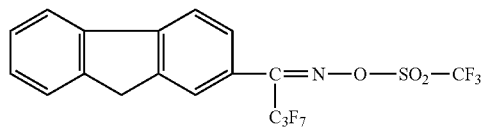
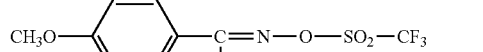
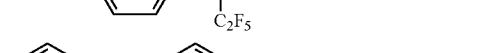
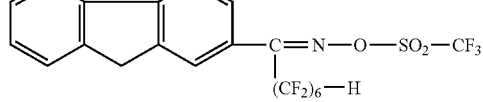
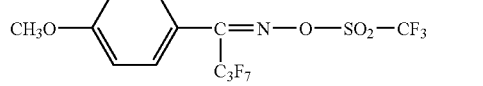
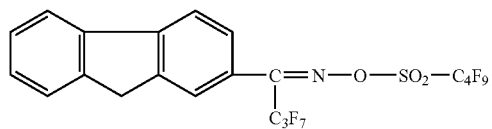
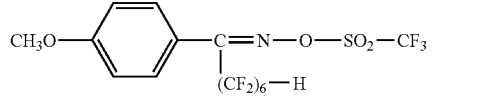
-continued
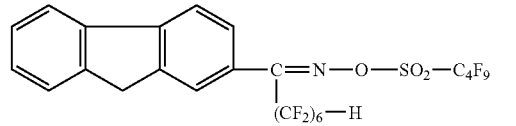
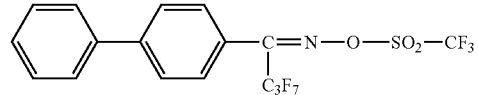
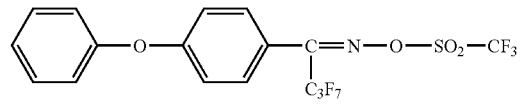
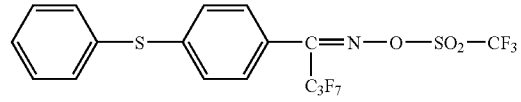
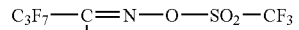
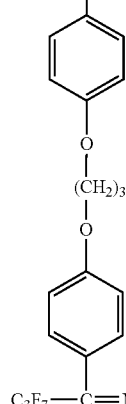

-continued

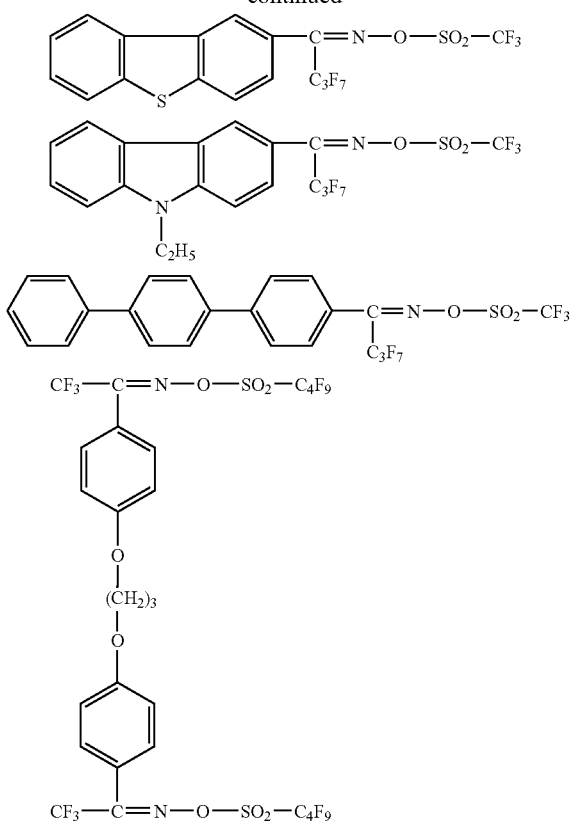

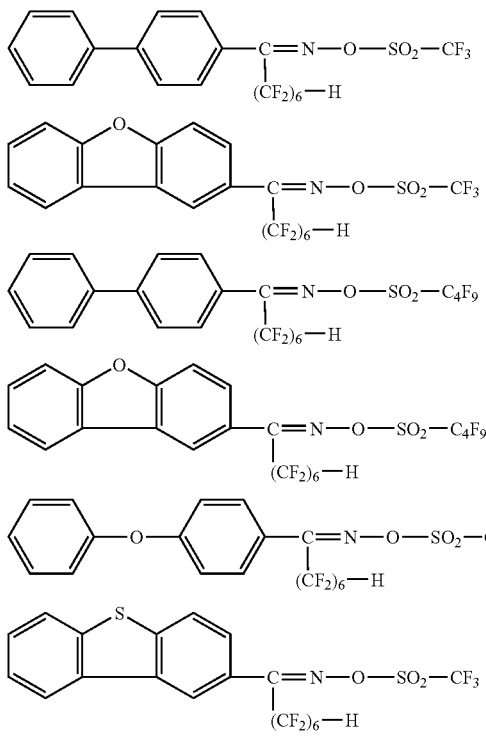

-continued

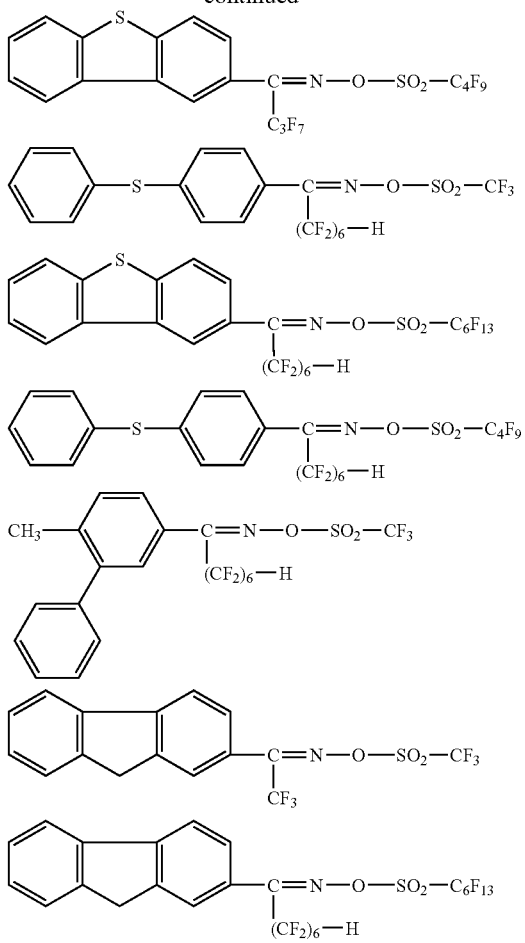

Of theses examples of the compounds, three compounds represented by the following general formulas (iv) to (vi) are preferred.

[General Formula 42]

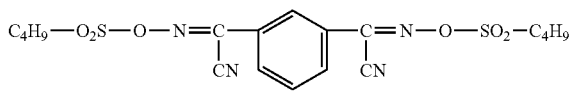 (iv)

[General Formula 43]

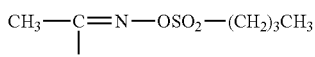 (v)

[General Formula 44]

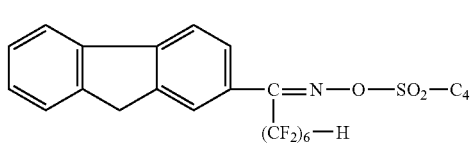 (vi)

Of the aforementioned diazomethane-based acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyelohexylsulfonyl)diazomethane, and bis(2,4-dimethylphenylsulfonyl)diazomethane.

Furthermore, specific examples of poly(bis-sulfonyl)diazomethanes include the structures shown below, such as 1,3-bis(phenylsulfonyldiazomethylsulfonyl)propane (in case of A=3), 1,4-bis(phenylsulfonyldiazomethylsulfonyl)butane (in case of A=4), 1,6-bis(phenylsulfonyldiazomethylsulfonyl)hexane (in case of A=6), 1,10-bis(phenylsulfonyldiazomethylsulfonyl)decane (in case of A=10), 1,2-bis(cyclohexylsulfonyldiazomethylsulfonyl)ethane (in case of B=2), 1,3-bis(cyclohexylsulfonyldiazomethylsulfonyl)propane (in case of B=3), 1,6-bis(cyclohexylsulfonyldiazomethylsulfonyl)hexane (in case of B=6), and 1,10-bis(cyclohexylsulfonyldiazomethylsulfonyl)decane (in case of B=10).

[General Formula 45]

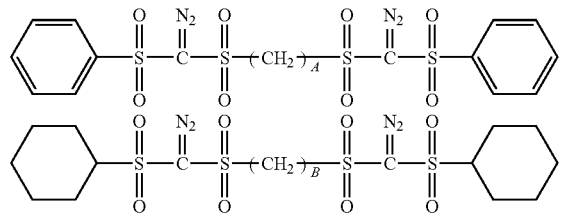

(vii)

In the present invention, as the component (B), onium salts that employ fluorinated alkylsulfonate as an anion are preferably used.

As the component (B), either a single acid generator may be used alone, or a combination of two or more different acid generators may be used.

In a positive resist composition of the present invention, the amount of the component (B) is within a range of 1 to 10 parts by weight, and preferably 0.5 to 30 parts by weight, relative to 100 parts by weight of the component (A). With the amount of the component within such a range, a uniform solution can be obtained, storage stability becomes preferable, and thus it is preferable.

<Other Components>

In a positive resist composition of the present invention, in order to improve the resist pattern shape and the long term stability (the post exposure stability of the latent image formed by the pattern-wise exposure of the resist layer), a nitrogen-containing organic compound (D) (hereafter referred to as the component (D)) may be added as an optional component.

A multitude of these components (D) have already been proposed, and any of these known compounds may be used, although an aliphatic amine, and particularly a secondary aliphatic amine or tertiary aliphatic amine is preferred. Here, the aliphatic amine is one having one or more aliphatic groups and these aliphatic groups preferably have 1 to 12 carbon atoms.

Examples of these aliphatic amines include amines in which at least one hydrogen atom of ammonia $NH_3$ has been substituted by an alkyl group or hydroxyalkyl group of no more than 12 carbon atoms (that is, alkylamines or alkyl alcohol amines). Specific examples of these aliphatic amines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octyl amine, tri-n-nonylamine, tri-n-decanylamine, and tri-n-dodecylamine; and alkyl alcohol amines such as diethanolamine, triethanolamine, diisopropanolamine, triisopropanolamine, di-n-octanolamine, and tri-n-octanolamine, Of these, alkyl alcohol amines and trialkylamines are preferred and alkyl alcohol amines are most preferable. Among the alkyl alcohol amines, triethanolamine or triisopropanolamine is most preferable.

These compounds can be used either alone, or in combinations of two or more different compounds.

The component (D) is typically used in a quantity within a range from 0.01 to 5.0 parts by weight relative to 100 parts by weight of the component (A).

Furthermore, in a positive resist composition of the present invention, in order to prevent any deterioration in sensitivity caused by the addition of the above component (D), and improve the resist pattern shape and the post exposure stability of the latent image formed by the pattern-wise exposure of the resist layer, an organic carboxylic acid, or a phosphorus oxo acid or derivative thereof (E) (hereafter, referred to as the component (E)) can also be added as another optional component. The component (D) and the component (E) can be used in combination, or either one can also be used alone.

Examples of suitable organic carboxylic acids include malonic acid, citric acid, malic acid, succinic acid, benzoic acid, and salicylic acid.

Examples of suitable phosphorus oxo acids or derivatives thereof include phosphoric acid or derivatives thereof such as esters, including phosphoric acid, di-n-butyl phosphate and diphenyl phosphate; phosphonic acid or derivatives thereof such as esters, including phosphonic acid, dimethyl phosphonate, di-n-butyl phosphonate, phenylphosphonic acid, diphenyl phosphonate, and dibenzyl phosphonate; and phosphinic acid or derivatives thereof such as esters, including phosphinic acid and phenylphosphinic acid, and of these, phosphonic acid is particularly preferred.

The component (E) is typically used in a quantity within a range from 0.01 to 5.0 parts by weight relative to 100 parts by weight of the component (A).

Other miscible additives can also be added to a positive resist composition of the present invention according to need, and examples include additive resins for improving the performance of the resist film, surfactants for improving the ease of application, dissolution inhibitors, plasticizers, stabilizers, colorants, halation prevention agents, and dyes.

A positive resist composition of the present invention can be produced by dissolving components in an organic solvent.

The organic solvent may be any solvent capable of dissolving each of the components used to generate a uniform solution, and either one, or two or more solvents selected from known materials used as the solvents for conventional chemically amplified resists can be used.

Suitable examples include lactones such as γ-butyrolactone; ketones such as acetone, methyl ethyl ketone, cyclohexanone, methyl isoamyl ketone and 2-heptanone; polyhydric alcohols and derivatives thereof such as ethylene glycol, ethylene glycol monoacetate, diethylene glycol, diethylene glycol monoacetate, propylene glycol, propylene glycol monoacetate, dipropylene glycol, or the monomethyl ether, monoethyl ether, monopropyl ether, monobutyl ether or monophenyl ether of dipropylene glycol monoacetate; cyclic ethers such as dioxane; and esters such as methyl lactate, ethyl lactate (EL), methyl acetate, ethyl acetate, butyl acetate, methyl pyruvate, ethyl pyruvate, methyl methoxypropionate, and ethyl ethoxypropionate. These organic solvents may be used either alone, or as a mixed solvent of two or more different solvents.

Furthermore, a mixed solvent of propylene glycol monomethyl ether acetate (PGMEA) and a polar solvent is preferred. In such cases, the mixing ratio (weight ratio) can be determined on the basis of the co-solubility of the PGMEA and the polar solvent, but is preferably within a range from 1:9 to 9:1, and even more preferably from 2:8 to 8:2.

More specifically, in those cases where EL is added as the polar solvent, the weight ratio of PGMEA:EL is preferably within a range from 1:9 to 9:1, and even more preferably from 2:8 to 8:2.

Furthermore, as the organic solvent, a mixed solvent of at least one of PGMEA and EL, together with γ-butyrolactone is also preferred. In such cases, the mixing ratio is set so that the weight ratio between the former and latter components is preferably within a range from 70:30 to 95:5.

There are no particular restrictions on the quantity used of the component (C), which is set in accordance with the desired film thickness so as to produce a concentration that enables favorable application to a substrate or the like, and is typically sufficient to produce a solid fraction concentration within the resist composition of 2 to 20% by weight, and preferably from 5 to 15% by weight.

<<Method of Forming a Resist Pattern>>

A method of forming a resist pattern according to the present invention can be conducted, for example, in the manner described below.

Namely, a positive resist composition described above is first applied to a support such as a silicon wafer using a spinner or the like, a prebake is then conducted under temperature conditions of 80 to 150° C., for a period of 40 to 120 seconds, and preferably for 60 to 90 seconds.

Subsequently, a selective exposure of the thus obtained resist film is performed with a use of an ArF exposure apparatus or the like, by irradiating ArF excimer laser light through a desired mask pattern, PEB (post exposure baking) is conducted under temperature conditions of 80 to 150° C., for a period of 40 to 120 seconds, and preferably for 60 to 90 seconds.

Subsequently, developing is conducted using an alkali developing solution such as a 0.1 to 10% by weight aqueous solution of tetramethylammonium hydroxide. A postbake may be conducted after the development if necessary.

In this manner, a resist pattern that is faithful to the mask pattern can be obtained.

An organic or inorganic anti-reflective film may also be provided between the substrate and the applied layer of the resist composition.

There are no particular restrictions on the wavelength used for the exposure, and an ArF excimer laser, KrF excimer laser, $F_2$ excimer laser, or other radiation such as EUV (extreme ultraviolet), VUV (vacuum ultraviolet), EB (electron beam), X-ray or soft X-ray radiation can be used. A resist composition according to the present invention is particularly effective for use with an ArF excimer laser.

According to a positive resist composition and a method of forming a resist pattern described above, a resist pattern exhibiting reduced defects and excellent in lithographic characteristics can be obtained.

The reasons the present invention enables the formation of a resist pattern with reduced defects and excellent lithographic characteristics are not entirely clear, but there are possible reasons as follows.

Namely, as one of methods of reducing defects, a method of introducing polar groups such as a hydroxyl group or a carboxyl group in a base resin so as to raise hydrophilic properties thereof and compatibility of a resist and a developer can be considered. However, since raising hydrophilic properties of the base resin is accompanied by deterioration in the lithographic characteristics, it is difficult to both obtain a reduction in defects and excellent lithographic properties.

As the cause, the polarity of an (α-lower alkyl)acrylic ester and an (α-lower alkyl)acrylic acid and the difference in a rate of polymerization can be considered. That is, when the (α-lower alkyl)acrylate ester is compared with the (α-lower alkyl)acrylic acid, the (α-lower alkyl)acrylic acid has a faster rate of polymerization. Therefore, in the resin conventionally used for the resist, since distribution of each structural unit becomes non-homogeneous, a moiety having a high hydrophobicity and a moiety having a low hydrophobicity in a molecule are generated. This is considered to be a deterioration in lithographic characteristics.

On the other hand, in the present invention, since the (α-lower alkyl)acrylate ester is only polymerized and the ester terminal thereof is dissociated by the action of the acid, unit distribution of the (α-lower alkyl)acrylic acid in the molecule is not biased. As a result, it is assumed that defects are reduced and lithographic characteristics become excellent.

Furthermore, from the researches conducted by the present inventors, when a resist using a copolymer obtained by polymerizing an (α-lower alkyl)acrylate ester under a presence of acid is compared with a resist using a copolymer obtained by polymerizing an (α-lower alkyl)acrylate ester and an (α-lower alkyl)acrylic acid without a presence of acid, the latter is deteriorated in lithographic characteristics such as DOF but the former exhibits excellent lithographic characteristics and includes reduced defects. Therefore, it is obvious that the former and the latter are slightly different in their structure.

EXAMPLES

Hereinafter, examples of the present invention will be described but the examples of the present invention are not limited thereto.

The abbreviations used in the following examples have the following meanings.

G: a structural unit derived from γ-butyrolactone methacrylate
Monomer G: γ-butyrolactone methacrylate
Ga: a structural unit derived from γ-butyrolactone acrylate
Monomer Ga: γ-butyrolactone acrylate
M: a structural unit derived from 2-methyl-2 adamanthyl methacrylate
Monomer M: 2-methyl-2 adamanthyl methacrylate
Ma: a structural unit derived from 2-methyl-2 adamanthyl acrylate
Monomer Ma: 2-methyl-2 adamanthyl acrylate
O: a structural unit derived from 3-hydroxy-1-adamanthyl methacrylate
Monomer O: 3-hydroxy-1-adamanthyl methacrylate
Oa: a structural unit derived from 3-hydroxy-1-adamanthyl acrylate
Monomer Oa: 3-hydroxy-1-adamanthyl acrylate
MA: a structural unit derived from a methacrylic acid
AA: a structural unit derived from an acrylic acid According to the following methods, the Mw, Mw/Mn, and proportions (mol ratio) of structural units constituting the copolymer were measured.

(1) Measurement of Mw and Mw/Mn of Copolymer by GPC

Measured according to GPC. The analytical conditions were as follows.

Apparatus: GPC 8220 (product name) produced by Tosoh Corporation
Detector: a differential refractive index (RI) detector
Columns: KF-804L (three columns) produced by Showa Denko K.K.
Sample: a sample for measurement was prepared by dissolving about 0.1 g of a powdery copolymer in about 1 ml of tetrahydrofuran. The amount of the sample injected into the GPC was 15 µl.

(2) Measurement of Proportions of Structural Units Derived from (α-lower alkyl)acrylate Ester in Copolymer ($^{13}$C-NMR)

Proportions (mol %) of structural units relative to structural units derived from all (α-lower alkyl)acrylate esters (sum of G or Ga, M or Ma, and O or Oa) in a copolymer were measured according to $_{13}$C-NMR under the analytical conditions as follows.

Apparatus: AV 400 (product name) produced by Bruker
Sample: a sample for measurement was prepared by dissolving about 1 g of a powdery copolymer and 0.1 g of Cr(acac)$_2$ in 1 g of methyl ethyl ketone (MEK) and 1 g of deutrated acetone ('acac'=acetylacetonate).
Measurement: a measurement tube of 10 mm in diameter was used; temperature: 40° C.; scanning: 10,000 times (3) Calculation of Proportions of Structural Units $^{13}$C-NMR measurement was made for a copolymer obtained in Synthesis Examples 1 to 5 and Comparative Synthesis Examples 1 to 5 (hereinafter, referred to as a copolymer (Q)) and a copolymer obtained under the same conditions as for the copolymer (Q) except that no sulfone in the examples was used (hereinafter, referred to as a copolymer (P)). Then, individual peak areas were determined as follows.

First, for the copolymer (P), using the peak area PN of total carbonyl carbon, the peak area PA of quaternary carbon of M or Ma, the peak area PC of the carbon bonded to oxygen other than carbonyl oxygen in the lactone bond of O or Oa, and the peak area PD of the carbon bonded to oxygen other than carbonyl oxygen in the ester bond of O or Oa, there was determined the peak area pI of carbonyl carbon derived from the polymerization initiator, according to the following equation (1).

$$pI=(PN-PA-PC-PD)/\{PA+(PC/2)+PD\} \quad \text{Equation (1)}$$

Then, for the copolymer (Q), using the peak area QN of total carbonyl carbon, the peak area QA of quaternary carbon of M or Ma, the peak area QC of the carbon bonded to oxygen other than carbonyl oxygen in the lactone bond of G or Ga, and the peak area QD of the carbon bonded to oxygen other than carbonyl oxygen in the ester bond of O or Oa, there were determined the ratios of M or Ma, AA or MA, G or Ga, and O or Oa in the copolymer (Q) to the sum of M or Ma, G or Ga, O or Oa, that is, qA, qB, qC and qD, according to the following equations (2) to (5).

$$qA=QA/\{QA+(QB/2)+QD\} \quad \text{Equation (2)}$$

$$qB=(QN-QA-QC-QD)/\{QA+(QC/2)+QD\}-p-I \quad \text{Equation (3)}$$

$$qC=(QC/2)/\{QA+(QC/2)+QD\} \quad \text{Equation (4)}$$

$$qD=QD/\{QA+(QC/2)+QD\} \quad \text{Equation (5)}$$

Further, there were determined the proportions of M or Ma, AA or MA, G or Ga, and O or Oa in the copolymer (Q), that is, q*A, q*B, q*C and q*D, according to the following equations (6) to (9).

$$q^*A=qA/\{qA+qB+qC+qD\} \quad \text{Equation (6)}$$

$$q^*B=qB/\{qA+qB+qC+qD\} \quad \text{Equation (7)}$$

$$q^*C=qC/\{qA+qB+qC+qD\} \quad \text{Equation (8)}$$

$$q^*D=qD/\{qA+qB+qC+qD\} \quad \text{Equation (9)}$$

Synthesis Example 1

In a container purged with nitrogen were placed 1080 g of methyl ethyl ketone (MEK), 50 g of MEK solution dissolved with 28 mg of sulfuric acid, 352 g of a monomer Ma, 265 g of a monomer G, and 186 g of a monomer Oa. They were made into a solution to prepare a homogeneous "monomer solution". In another container purged with nitrogen was placed 52 g of MEK and 26 g of 2,2'-azobisisobutylate dimethyl (MAIB) to prepare a homogeneous "initiator solution". 680 g of MEK was placed in a reactor fitted with a stirrer and a cooler. The reactor inside was purged with nitrogen and heated to 79° C. The monomer solution and the initiator solution kept at room temperature (about 25° C.) were dropped into the reactor kept at 79 to 81° C., using a metering pump, at a given rate in 4 hours. After the completion of the dropping, the reactor inside was kept at 80 to 81° C. for 2 hours to conduct ageing and then cooled to room temperature, followed by taking-out of the polymerization mixture.

8100 g of n-hexane was placed in a 20 liter container. The container inside was cooled to 15° C. with stirring and this state was maintained. Thereinto was dropped 2700 g of the polymerization mixture to separate out a copolymer. Stirring was conducted for 30 minutes and filtration was conducted to collect a wet cake. The wet cake was returned to the container; thereto was added 5400 g of a mixed solvent of n-hexane and MEK. Stirring was conducted for 30 minutes for washing, after which filtration was conducted. This washing of wet cake was repeated once. The resulting wet cake was subjected to drying under reduced pressure at 60° C. or below for 1 hours, to obtain a dried powder (copolymer (A)-1).

The copolymer (A)-1 was measured for Mw, Mw/Mn, and proportions of recurring units by GPC. There are shown, in Table 1, the kind of the acid used in preparation of the copolymer, the concentration (mass ppm) of the acid in the reaction system, and the measurement results of the Mw, Mw/Mn and proportions of structural units, of the copolymer thus obtained.

Synthesis Example 2

A copolymer (A)-2 was prepared in the same manner as in Synthesis Example 1 except that the amount of sulfuric acid used was changed to 34 mg. There are shown, in Table 1, the kind of the acid used in preparation of the copolymer, the concentration (mass ppm) of the acid in the reaction system, and the measurement results of the Mw, Mw/Mn and proportions of structural units, of the copolymer thus obtained.

Synthesis Example 3

A copolymer (A)-3 was prepared in the same manner as in Synthesis Example 1 except that the amount of sulfuric acid used was changed to 39 mg. There are shown, in Table 1, the kind of the acid used in preparation of the copolymer, the concentration (mass ppm) of the acid in the reaction system, and the measurement results of the Mw, Mw/Mn and proportions of structural units, of the copolymer thus obtained.

Synthesis Example 4

A copolymer (A)-4 was prepared in the same manner as in Synthesis Example 1 except that there were used 384 g of a monomer M, 250 g of a monomer Ga, 179 g of a monomer O and 31 mg of sulfuric acid and, for preparation of an initiator solution, 64 g of MEK and 32 g of MAIB. There are shown, in Table 1, the kind of the acid used in preparation of the copolymer, the concentration (mass ppm) of the acid in the reaction system, and the measurement results of the Mw, Mw/Mn and proportions of structural units, of the copolymer thus obtained.

Synthesis Example 5

A copolymer (A)-5 was prepared in the same manner as in Synthesis Example 1 except that 390 mg of trifluoroacetic acid (TFA) was used instead of the sulfuric acid. There are shown, in Table 1, the kind of the acid used in preparation of the copolymer, the concentration (mass ppm) of the acid in the reaction system, and the measurement results of the Mw, Mw/Mn and proportions of structural units, of the copolymer thus obtained.

Comparative Synthesis Example 1

A copolymer (A)-6 was prepared in the same manner as in Synthesis Example 1 except that no sulfuric acid was used. There are shown, in Table 1, the kind of the acid used in preparation of the copolymer, the concentration (mass ppm) of the acid in the reaction system, and the measurement results of the Mw, Mw/Mn and proportions of structural units, of the copolymer thus obtained.

Comparative Synthesis Example 2

A copolymer (A)-7 was prepared in the same manner as in Synthesis Example 1 except that no sulfuric acid was used, 11.5 g of acrylic acid was added as a new monomer, and the amount of a monomer Ma used was changed to 317 g. There are shown, in Table 1, the kind of the acid used in preparation of the copolymer, the concentration (mass ppm) of the acid in the reaction system, and the measurement results of the Mw, Mw/Mn and proportions of structural units, of the copolymer thus obtained.

Comparative Synthesis Example 3

A copolymer (A)-8 was prepared in the same manner as in Comparative Synthesis Example 2 except that the addition amount of acrylic acid was changed to 17.3 g and the amount of a monomer Ma used was changed to 299 g. There are shown, in Table 1, the kind of the acid used in preparation of the copolymer, the concentration (mass ppm) of the acid in the reaction system, and the measurement results of the Mw, Mw/Mn and proportions of structural units, of the copolymer thus obtained.

Comparative Synthesis Example 4

A copolymer (A)-9 was prepared in the same manner as in Synthesis Example 4 except that no sulfuric acid was used. There are shown, in Table 1, the kind of the acid used in preparation of the copolymer, the concentration (mass ppm) of the acid in the reaction system, and the measurement results of the Mw, Mw/Mn and proportions of structural units, of the copolymer thus obtained.

Comparative Synthesis Example 5

A copolymer (A)-10 was prepared in the same manner as in Synthesis Example 4 except that no sulfuric acid was used, 13.8 g of acrylic acid was added as a new monomer, and the amount of a monomer M used was changed to 347 g. There are shown, in Table 1, the kind of the acid used in preparation of the copolymer, the concentration (mass ppm) of the acid in the reaction system, and the measurement results of the Mw, Mw/Mn and proportions of structural units, of the copolymer thus obtained.

TABLE 1

| | Acid | | GPC | | Structural unit composition (mol %) | | | | | | | |
|---|---|---|---|---|---|---|---|---|---|---|---|---|
| | Kinds of acid | Conc. ppm | Mw | Mw/Mn | G | Ga | M | Ma | O | Oa | MA | AA |
| Syn. Ex. 1 | Sulfuric acid | 10 | 10,350 | 2.17 | 40.5 | — | — | 34.9 | — | 21.0 | — | 3.6 |
| Syn. Ex. 2 | Sulfuric acid | 12 | 9,980 | 2.17 | 40.5 | — | — | 34.2 | — | 21.2 | — | 4.1 |
| Syn. Ex. 3 | Sulfuric acid | 14 | 9,970 | 2.14 | 40.8 | — | — | 32.7 | — | 21.3 | — | 5.2 |
| Syn. Ex. 4 | Sulfuric acid | 11 | 10,280 | 2.02 | — | 40.3 | 35.1 | — | 20.1 | — | 4.5 | — |
| Syn. Ex. 5 | TFA | 140 | 10,150 | 2.11 | 40.5 | — | — | 33.6 | — | 21.1 | — | 4.8 |
| Com. Syn. Ex. 1 | — | — | 9,990 | 2.14 | 40.0 | — | — | 38.9 | — | 21.1 | — | 0.0 |
| Com. Syn. Ex. 2 | — | — | 10,210 | 2.21 | 40.2 | — | — | 35.3 | — | 21.1 | — | 3.4 |
| Com. Syn. Ex. 3 | — | — | 10,400 | 2.20 | 40.3 | — | — | 33.5 | — | 21.3 | — | 4.9 |
| Com. Syn. Ex. 4 | — | — | 11,320 | 2.03 | — | 38.8 | 41.4 | — | 19.8 | — | 0.0 | — |
| Com. Syn. Ex. 5 | — | — | 10,560 | 2.11 | — | 39.2 | 37.1 | — | 19.7 | — | 4.0 | — |

Examples 1 to 5 and Comparative Examples 1 to 5

A positive resist composition solution was prepared by mixing a component (A), a component (B), a component (D), a component (E), and an organic solvent in a composition and a blending amount shown in Table 2 and dissolving the mixture.

The simplified references of each of the components in Table 2 has the following meanings. The values in square brackets represent a blending amount (parts by weight).
(B)-1: 4-methylphenyldiphenylsulfonium nonafluorobutanesulfonate
(D)-1: triethanolamine
(E)-1: salicylic acid
(S)-1: a mixture solvent of PGMEA:EL=6:4 (mass ratio)

TABLE 2

|  | Component (A) | Component (B) | Component (D) | Component (E) | Organic solvent |
|---|---|---|---|---|---|
| Ex. 1 | (A)-1 [100] | (B)-1 [3.5] | (D)-1 [0.1] | — | (S)-1 [750] |
| Ex. 2 | (A)-2 [100] | (B)-1 [3.5] | (D)-1 [0.1] | — | (S)-1 [750] |
| Ex. 3 | (A)-3 [100] | (B)-1 [3.5] | (D)-1 [0.1] | — | (S)-1 [750] |
| Ex. 4 | (A)-4 [100] | (B)-1 [3.5] | (D)-1 [0.1] | (E)-1 [0.1] | (S)-1 [750] |
| Ex. 5 | (A)-5 [100] | (B)-1 [3.5] | (D)-1 [0.1] | — | (S)-1 [750] |
| Comp. Ex. 1 | (A)-6 [100] | (B)-1 [3.5] | (D)-1 [0.1] | — | (S)-1 [750] |
| Comp. Ex. 2 | (A)-7 [100] | (B)-1 [3.5] | (D)-1 [0.1] | — | (S)-1 [750] |
| Comp. Ex. 3 | (A)-8 [100] | (B)-1 [3.5] | (D)-1 [0.1] | — | (S)-1 [750] |
| Comp. Ex. 4 | (A)-9 [100] | (B)-1 [3.5] | (D)-1 [0.1] | (E)-1 [0.1] | (S)-1 [750] |
| Comp. Ex. 5 | (A)-10 [100] | (B)-1 [3.5] | (D)-1 [0.1] | (E)-1 [0.1] | (S)-1 [750] |

Hereinafter, the following evaluations were conducted by using a positive resist composition solution thus obtained.

Evaluation of Sensitivity (Eop)

An organic anti-reflection film composition "ARC-29A" (trade name, a product of Brewer Science Co.) was coated on an 8 inch silicon wafer using a spinner, followed by firing on a hot plate at 205° C. for 60 seconds for drying, to form an organic anti-reflection film of 77 nm in thickness. On the anti-reflection film was coated a solution of a positive resist composition solution using a spinner, followed by prebaking (PAB) on a hotplate at 105° C. for 90 seconds for drying, to form a resist film of 220 nm in thickness.

Using an ArF exposure system NSR-S306 (a product of Nikon Corporation, NA (number of aperture)=0.78, ½ annular illumination), the resist film was irradiated with an ArF excimer laser beam (193 nm) selectively via a mask pattern (6% half tone).

Then, a PEB treatment was conducted at 110° C. for 90 seconds, puddle development was conducted at 23° C. for 60 seconds using a 2.38 mass % aqueous tetramethylammonium hydroxide solution, washing with water was conducted for 20 seconds, followed by drying. The temperature of PAB and PEB is shown in Table 3.

There was determined an optimum exposure Eop (mJ/cm$^2$) at which a contact hole pattern having a diameter of 100 nm and a pitch of 220 nm was formed. The results are shown in Table 3.

Evaluation of Width of Depth of Focus (DOF)

In the above Eop, the focus was appropriately shifted vertically, whereby was determined a width (μm) of depth of focus (DOF) at which the above contact hole pattern could be obtained in a range of diameter change of 100 nm±10%. The results are shown in Table 4.

Evaluation of Defect

A solution of a positive resist composition was coated on an 8 inch silicon wafer subjected to a hexamethyldisilazane (HMDS) treatment, directly using a spinner, followed by prebaking (PAB) on a hot plate at 105° C. for 90 seconds for drying, to obtain a resist film of 220 nm in thickness.

Using an ArF exposure system NSR-S306 (a product of Nikon Corporation, NA (number of aperture)=0.78, σ=0.30), the resist film was irradiated with an ArF excimer laser beam (193 nm) selectively via a mask pattern (binary).

Then, a PEB treatment was conducted at 110° C. for 90 seconds, puddle development was conducted at 23° C. for 60 seconds using a 2.38 mass % aqueous tetramethylammonium hydroxide solution, a rinsing solution was dropped under the conditions of 1,000 rpm for 1 second and 500 rpm for 15 seconds (the forced conditions under which defect generation occurred easily), followed by drying, to form a resist pattern.

The pattern was a dense hole pattern in which holes of 300 nm in diameter were arranged at intervals of 300 nm.

Next, the number of defects in the wafer was measured using a surface defect observation apparatus KLA 2351 (product name) produced by KLA Tencor.

The same evaluation was repeated once more and an average of the defect numbers of two wafers was determined. The results are shown in Table 3.

TABLE 3

|  | PAB (° C.) | PEB (° C.) | Eop (mJ/cm$^2$) | DOF (μm) | Defects (number of defects) |
|---|---|---|---|---|---|
| Ex. 1 | 110 | 100 | 23.5 | 4.0 | 1698 |
| Ex. 2 | 110 | 100 | 22.0 | 4.0 | 442 |
| Ex. 3 | 110 | 100 | 21.5 | 4.0 | 376 |
| Ex. 4 | 100 | 105 | 23.0 | 4.0 | 150 |
| Ex. 5 | 110 | 100 | 22.0 | 4.0 | 400 |
| Comp. Ex. 1 | 110 | 100 | — | — | 67000 |
| Comp. Ex. 2 | 110 | 100 | — | — | 11294 |
| Comp. Ex. 3 | 110 | 100 | 20.5 | 3.0 | 442 |
| Comp. Ex. 4 | 100 | 105 | 29.0 | 2.5 | 45900 |
| Comp. Ex. 5 | 100 | 105 | 27.0 | 3.5 | 47351 |

As described above, Examples 1 to 5 each using a copolymer produced under the presence of a sulfuric acid or a trifluoroacetate were each good in lithographic properties such as large DOF and also had a small number of defects.

In contrast, Comparative Examples 1 to 5 each using a copolymer produced without adding the sulfuric acid were insufficient in lithography properties, particularly in DOF. Comparative Examples 1 and 2 had a large number of defects and, therefore, other items were not evaluated for these Comparative Examples. Comparative Example 3 using a copolymer containing 4.9 mol % of AA obtained by acrylic acid had a small number of defects but insufficient in DOF. Comparative Example 5 using a copolymer containing 4 mol % of MA obtained by methacrylic acid was poor in lithographic properties such as small in DOF and had a large number of defects.

The invention claimed is:

1. A positive resist composition comprising: a resin component (A) which has on a main chain a structural unit (a1) derived from an (α-lower alkyl)acrylate ester and exhibits increased alkali solubility under the action of an acid, and an acid generating component (B) which generates an acid upon irradiation with radiation,
wherein the resin component (A) is a copolymer comprising, as the structural unit (a1),
a structural unit (a11) derived from (α-lower alkyl)acrylate ester which has acid dissociable dissolution inhibiting groups,
a structural unit (a12) derived from (α-lower alkyl)acrylate ester which includes a lactone-containing monocyclic or polycyclic group, and
a structural unit (a13) derived from an (α-alkyl)acrylate ester that contains a polar group-containing aliphatic hydrocarbon group,
and a structural unit which is different from the structural unit (a1), is obtained by incorporating sulfuric acid or trifluoroacetic acid when polymerizing an (α-lower alkyl) acrylate ester monomer, has the structure of an (α-lower alkyl) acrylic acid, and is derived from the structural unit (a1) or the (α-lower alkyl) acrylate ester monomer, wherein the sulfuric acid or trifluoroacetic acid reacts on a portion of the (α-lower alkyl) acrylate ester monomer before polymerization and/or a part of the structural unit (a1) in the polymer generated by polymerizing the monomer and dissociates the acrylate ester terminal.

2. The positive resist composition according to claim 1, wherein the component (A) is a copolymer obtained by polymerizing the monomer in a solution in the presence of sulfuric acid or trifluoroacetic acid at a concentration of 0.1 to 1,000 ppm.

3. The positive resist composition according to claim 1, wherein the resin component (A) is a copolymer having, as the structural unit (a1),
a structural unit (a11) derived from (α-lower alkyl)acrylate ester which has acid dissociable dissolution inhibiting groups,
a structural unit (a12) derived from (α-lower alkyl)acrylate ester which includes a lactone-containing monocyclic group, and
a structural unit (a13) derived from an (α-lower alkyl) acrylate ester that contains a polar group-containing aliphatic hydrocarbon group,
and a structural unit (a2) derived from (α-lower alkyl) acrylic acid, and the structural unit (a2) is at least one selected from the group consisting of a structural unit (a2"-1) derived from (α-lower alkyl)acrylic acid obtained by dissolving an ester terminal of (α-lower alkyl)acrylate ester by the action of sulfuric acid or trifluoroacetic acid and a structural unit (a2"-2) obtained by dissolving an ester terminal of a structural unit derived from (α-lower alkyl)acrylate ester by the action of sulfuric acid or trifluoroacetic acid.

4. The positive resist composition according to claim 3, wherein the structural unit (a2) is at least one selected from the group consisting of a structural unit (a2"-1-1) derived from (α-lower alkyl)acrylic acid obtained by dissolving an acid dissociable dissolution inhibiting group of (α-lower alkyl)acrylate ester by the action of sulfuric acid or trifluoroacetic acid and a structural unit (a2"-2-1) obtained by dissolving the acid dissociable dissolution inhibiting group of the structural unit (a11) by the action of sulfuric acid or trifluoroacetic acid.

5. The positive resist composition according to claim 1, wherein the structural unit (a11) is a structural unit derived from (α-lower alkyl)acrylate ester which has an acid dissociable dissolution inhibiting group containing an aliphatic cyclic group.

6. The positive resist composition according to claim 5, wherein the structural unit (a11) is selected from the group consisting of structural units represented by the following general formula (a1-1-01) and the general formula (a1-1-03):

[General Formula 1]

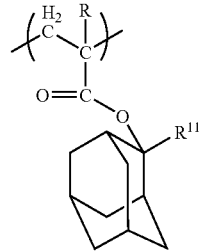

(a1-1-01)

wherein, R represents a hydrogen atom or a lower alkyl group, and $R^{11}$ represents a lower alkyl group;

[General Formula 2]

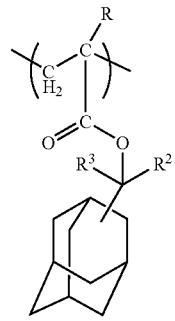

(a1-1-03)

wherein, R represents a hydrogen atom or a lower alkyl group, and $R^2$ and $R^3$ each represents, independently, a lower alkyl group.

7. The positive resist composition according to claim 1, wherein the structural unit (a12) is at least one selected from the group consisting of structural units represented by the following general formula (a2-1):

[General Formula 3]

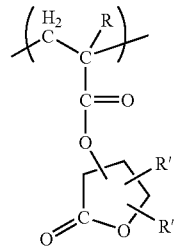

(a2-1)

wherein, R represents a hydrogen atom or a lower alkyl group, and each R' represents, independently, a hydrogen atom, a lower alkyl group, or an alkoxy group having 1 to 5 carbon atom(s).

8. The positive resist composition according to claim 1, wherein the structural unit (a13) is at least one selected from the group consisting of structural units represented by the following general formula (a3-1):

[General Formula 4]

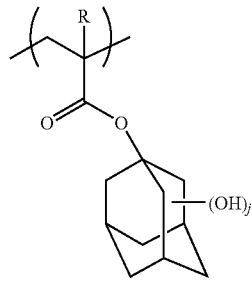

(a3-1)

wherein, R represents a hydrogen atom or a lower alkyl group and j represents an integer of 1 to 3.

9. The positive resist composition according to claim 1, further comprising a nitrogen-containing organic compound (D).

10. A method of forming a resist pattern comprising: forming a resist film on a substrate by using the positive resist composition of any one of claims 1 to 6, 7, 8 and 9, exposing the resist film, and forming a resist pattern by developing the resist film.

* * * * *

UNITED STATES PATENT AND TRADEMARK OFFICE
CERTIFICATE OF CORRECTION

PATENT NO.       : 7,972,762 B2
APPLICATION NO.  : 11/913912
DATED            : July 5, 2011
INVENTOR(S)      : Masaaki Muroi et al.

It is certified that error appears in the above-identified patent and that said Letters Patent is hereby corrected as shown below:

On the Title Page Item (75) under Inventors, Change the place of residence for Takanori Yamagishi from "Ichihara" to --Funabashi--.

At Column 7, Line 49, Change "aromaticity," to --aromaticity.--.

At Column 9, Line 57, Change "15-carbon" to --15 carbon--.

At Column 39, Line 55, Change "$R^{12}$" to --$R^{12}$,--.

At Column 42, Line 59, Change "(a 12)." to --(a12).--.

At Column 51, Line 57, Change "norbonyl" to --norbornyl--.

At Column 51, Line 58, Change "norbonyl" to --norbornyl--.

At Column 54, Line 32, Change "hydroxyalky" to --hydroxyalkyl--.

At Column 54, Line 39, Change "methyl butyronitrile)," to --methylbutyronitrile),--.

At Column 54, Line 45, Change "tertramethyl" to --tetramethyl--.

At Column 54, Line 53, Change "dodecanthiol," to --dodecanethiol,--.

At Column 55, Line 2, Change "butylolactone" to --butyrolactone--.

At Column 61, Line 21, Change "perfloroalkyl" to --perfluoroalkyl--.

At Column 64, Line 23, Change "(cyclohexyl sulfonyloxyimino)" to --(cyclohexylsulfonyloxyimino)--.

At Column 64, Line 24, Change "(α-" to --α- --.

At Column 68, Line 39, Change "theses" to --these--.

At Column 69, Line 1-2, Change "bis(cyelohexylsulfonyl)diazomethane," to --bis(cyclohexylsulfonyl)diazomethane,--.

At Column 70, Line 2, Change "tri-n-hex ylamine," to --tri-n-hexylamine,--.

At Column 73, Line 26, Change "deutrated" to --deuterated--.

At Column 73, Line 40, Change "O or Oa," to --G or Ga,--.

Signed and Sealed this
Thirteenth Day of December, 2011

David J. Kappos
*Director of the United States Patent and Trademark Office*

CERTIFICATE OF CORRECTION (continued)
U.S. Pat. No. 7,972,762 B2

At Column 79, Line 16, In Claim 1, change "(α-alkyl)acrylate" to --(α-lower alkyl)acrylate--.

At Column 79, Line 42, In Claim 3, change "(a12 )" to --(a12)--.

At Column 79, Line 44, In Claim 3, after "monocyclic" insert --or polycylic--.